US012164148B2

(12) United States Patent  
Venkatesan et al.

(10) Patent No.: US 12,164,148 B2  
(45) Date of Patent: Dec. 10, 2024

(54) LOOPBACK WAVEGUIDE

(71) Applicant: POET Technologies, Inc., Allentown, PA (US)

(72) Inventors: Suresh Venkatesan, Los Gatos, CA (US); Yee Loy Lam, Singapore (SG)

(73) Assignee: POET Technologies, Inc., PA (US)

( * ) Notice: Subject to any disclaimer, the term of this patent is extended or adjusted under 35 U.S.C. 154(b) by 0 days.

(21) Appl. No.: 18/126,562

(22) Filed: Mar. 27, 2023

(65) Prior Publication Data

US 2023/0384516 A1 Nov. 30, 2023

Related U.S. Application Data

(63) Continuation of application No. 17/242,584, filed on Apr. 28, 2021, now Pat. No. 11,614,584.

(60) Provisional application No. 63/016,532, filed on Apr. 28, 2020.

(51) Int. Cl.
| | |
|---|---|
| *G01M 11/02* | (2006.01) |
| *G01M 11/00* | (2006.01) |
| *G01R 31/311* | (2006.01) |
| *G02B 6/12* | (2006.01) |
| *G02B 6/122* | (2006.01) |
| *G02B 6/43* | (2006.01) |

(52) U.S. Cl.
CPC ........... *G02B 6/1225* (2013.01); *G01M 11/30* (2013.01); *G01R 31/311* (2013.01); *G02B 6/12016* (2013.01); *G02B 6/43* (2013.01); *G01M 11/0207* (2013.01); *G02B 2006/1213* (2013.01); *G02B 2006/12147* (2013.01)

(58) Field of Classification Search
CPC .................................................. G01M 11/0207
See application file for complete search history.

(56) References Cited

U.S. PATENT DOCUMENTS

| | | | |
|---|---|---|---|
| 2005/0094925 A1* | 5/2005 | Kish ................... | G02B 6/12023 385/14 |
| 2012/0326060 A1* | 12/2012 | Kenane ................... | G01J 3/513 250/578.1 |
| 2020/0033228 A1* | 1/2020 | Piazza .................. | G01M 11/335 |
| 2020/0044739 A1* | 2/2020 | Sugiyama .............. | G01M 11/33 |
| 2020/0049737 A1* | 2/2020 | Wang .................. | G01R 1/06772 |

* cited by examiner

Primary Examiner — Charlie Y Peng  
(74) Attorney, Agent, or Firm — Tue Nguyen

(57) ABSTRACT

A structure for, and method of, forming a first optoelectronic circuitry that generates an optical signal, a second optoelectronic circuitry that receives an optical signal, and a loopback waveguide that connects the output from the first optoelectronic circuitry to the second optoelectronic circuitry on an interposer substrate are described. The connected circuits, together comprising a photonic integrated circuit, are electrically tested using electrical signals that are provided via probing contact pads on the PIC die. Electrical activation of the optoelectrical sending devices and the subsequent detection and measurement of the optical signals in the receiving devices, in embodiments, provides information on the operability or functionality of the PIC on the die at the wafer level, prior to die separation or singulation, using the electrical and optical components of the PIC circuit.

20 Claims, 25 Drawing Sheets

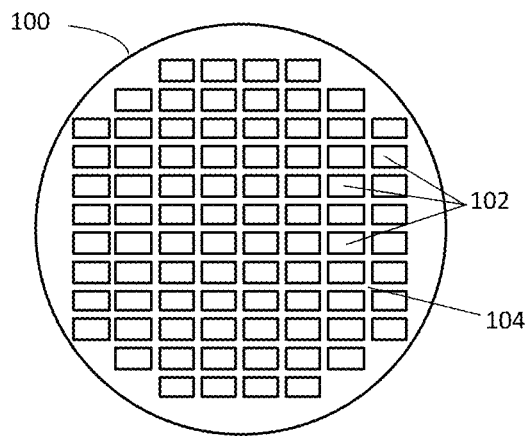
FIG. 1A
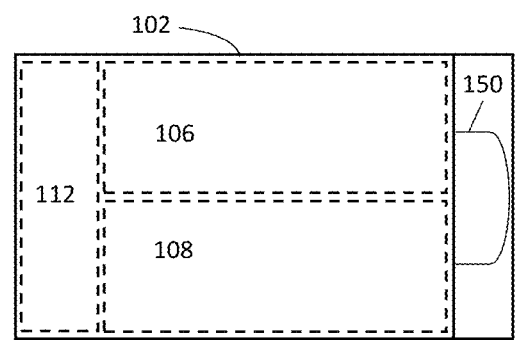
FIG. 1B
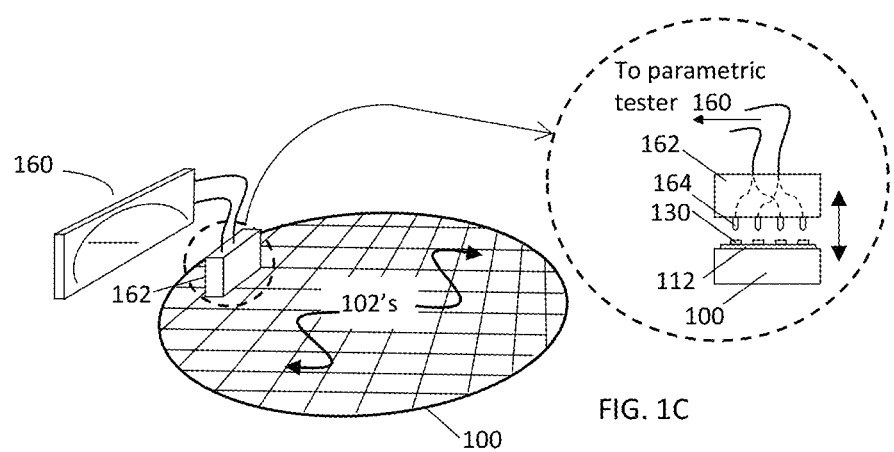
FIG. 1C
FIG. 1

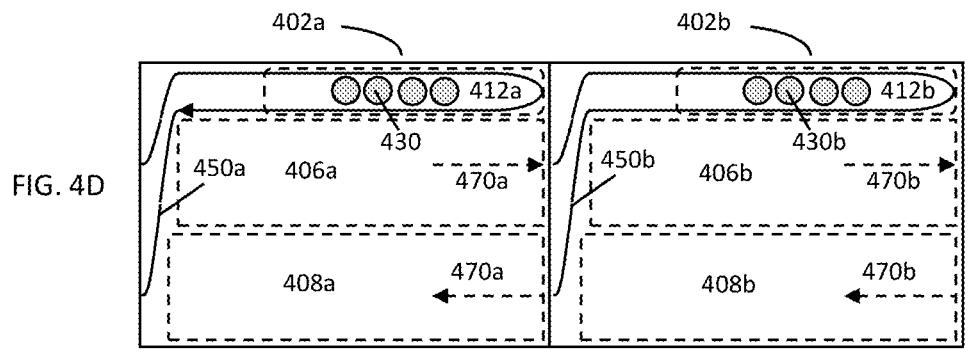
FIG. 4D
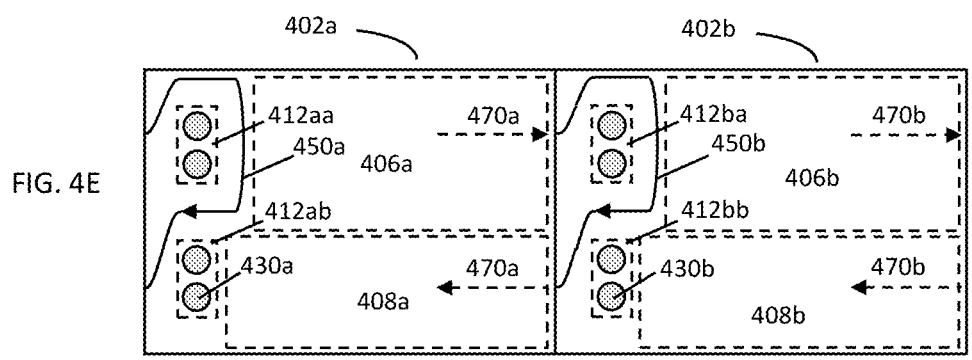
FIG. 4E
FIG. 4 (continued)

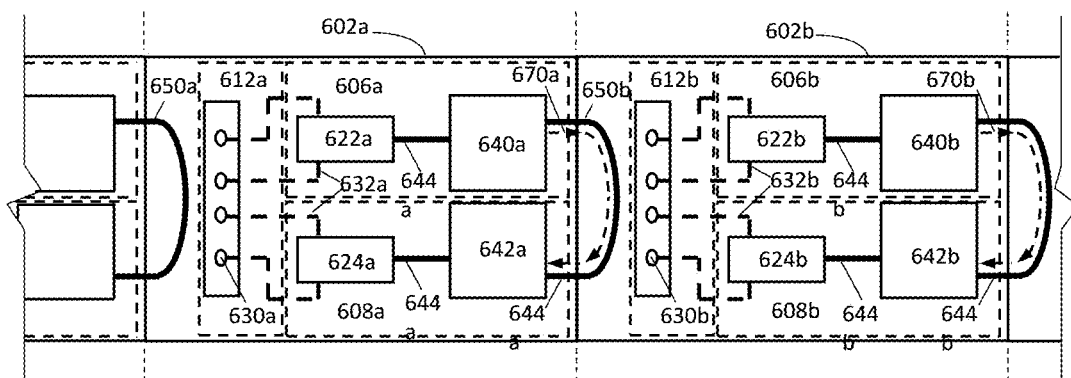
(i) Top view
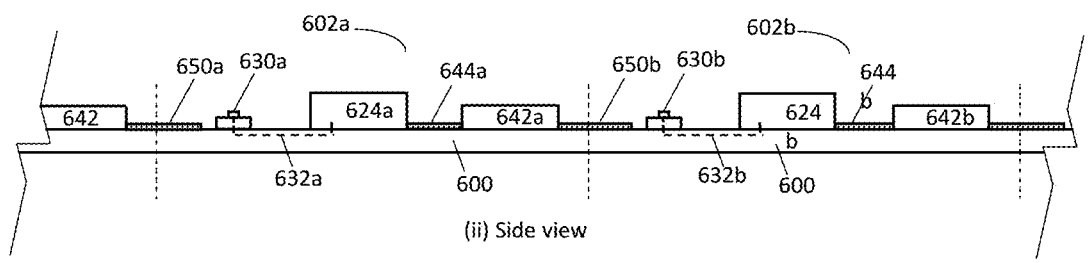
(ii) Side view
FIG. 6A

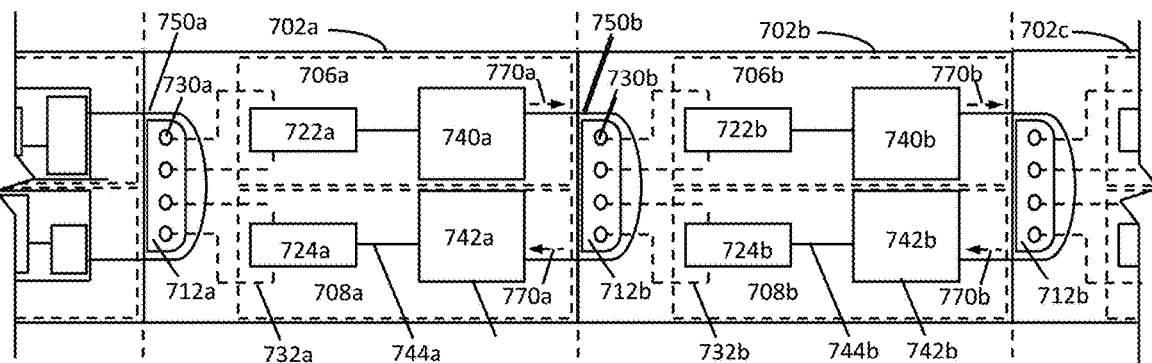
(i) Top view
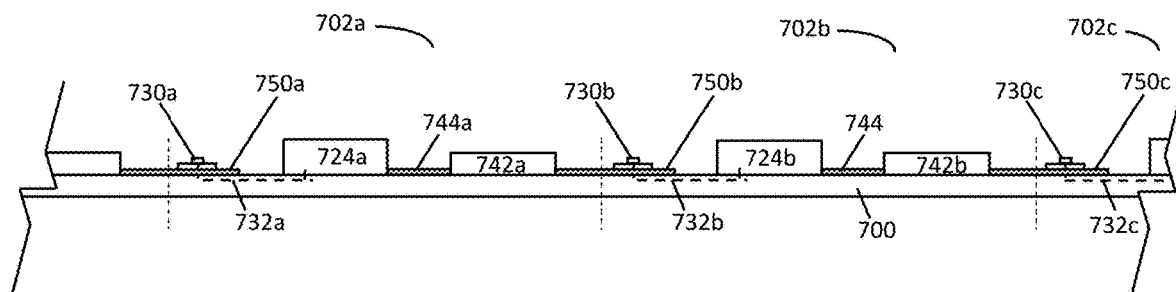
(ii) Side view
FIG. 7A

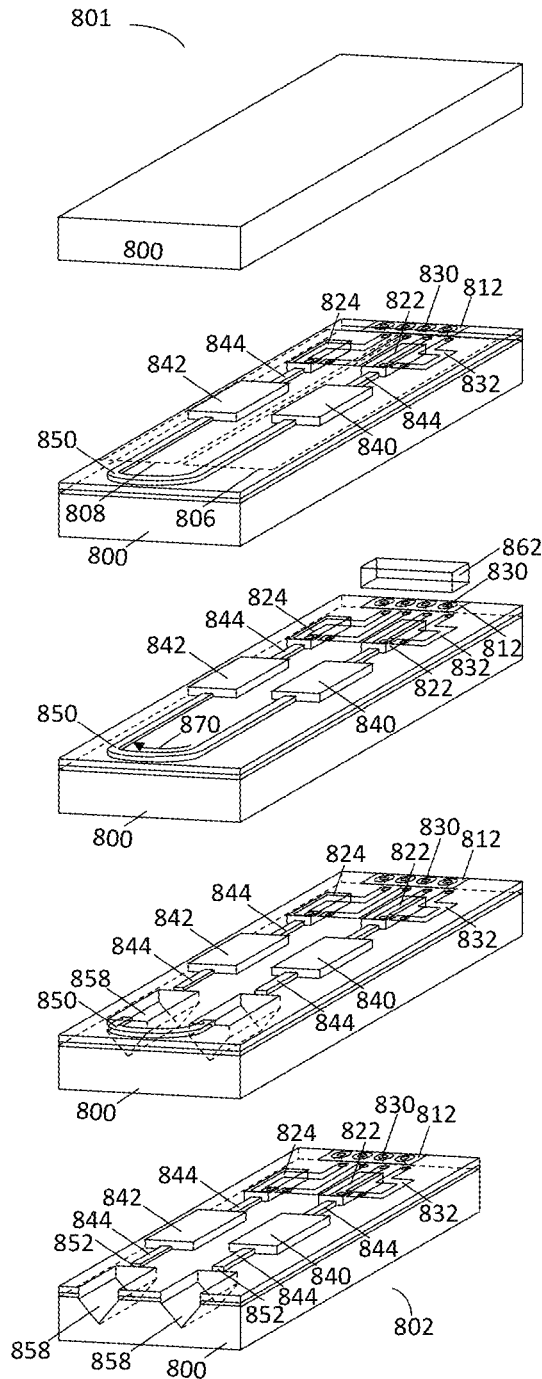

FIG. 8A Form a Substrate 880

FIG. 8B Form first and second optoelectrical circuitries, loopback waveguide, and electrical interface with electrical contact pads 882

FIG. 8C Perform electrical testing of first and second circuitries utilizing the loopback waveguide 884

FIG. 8D Perform additional processing steps that includes the removal of at least a part of the loopback waveguide 886

FIG. 8E Singulate the PIC die 888

FIG. 8

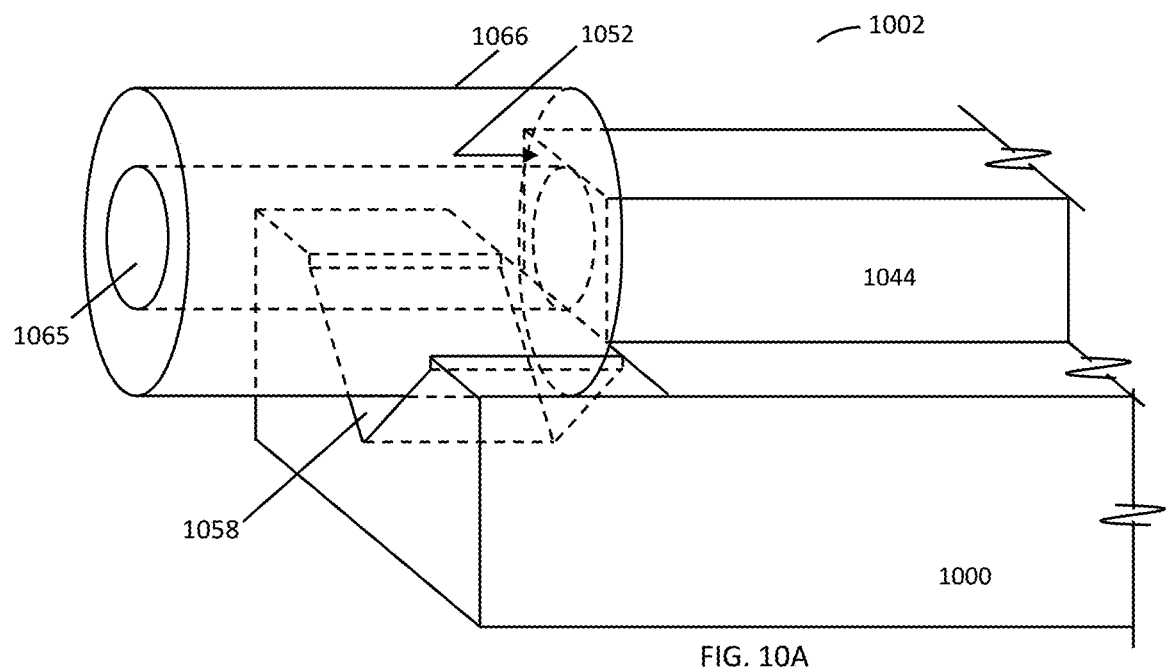
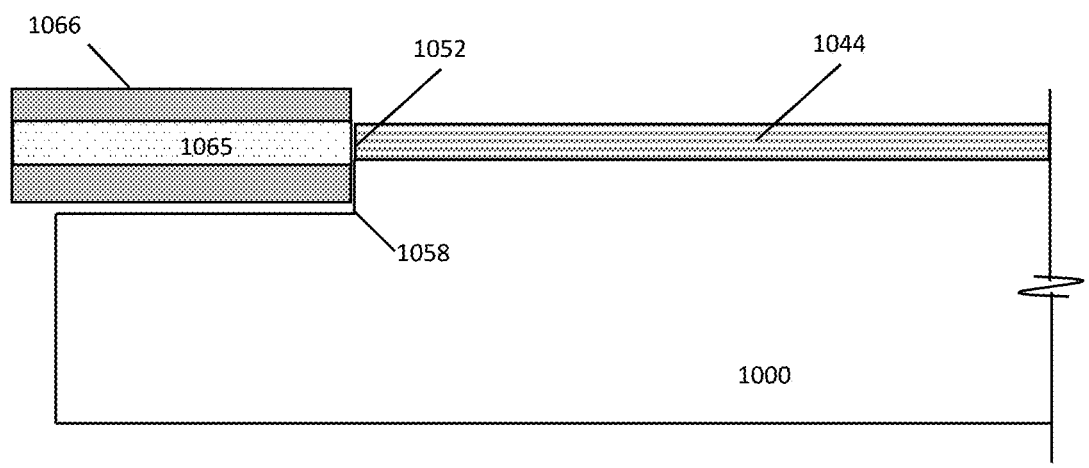
FIG. 10

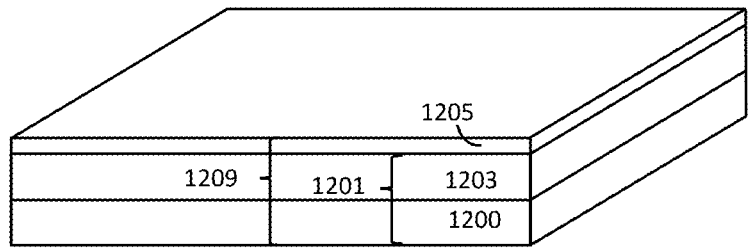

FIG. 12A: Form a planar waveguide layer 1205 on a base structure 1201, wherein the base structure includes an optional electrical interconnect layer 1203 disposed on a substrate 1200 (Step 1180)

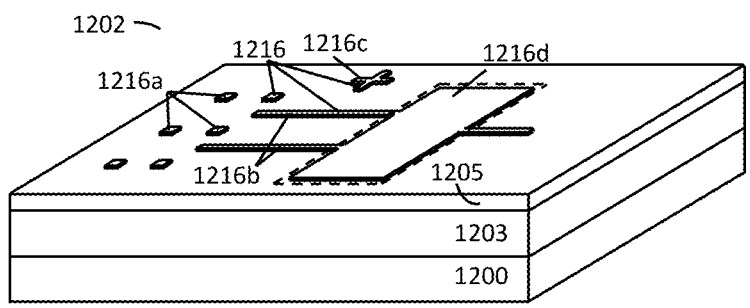

FIG. 12B: Form a patterned hard mask 1216 shown for the formation of planar waveguides, fiducial marks, and alignment pillars (Step 1182a)

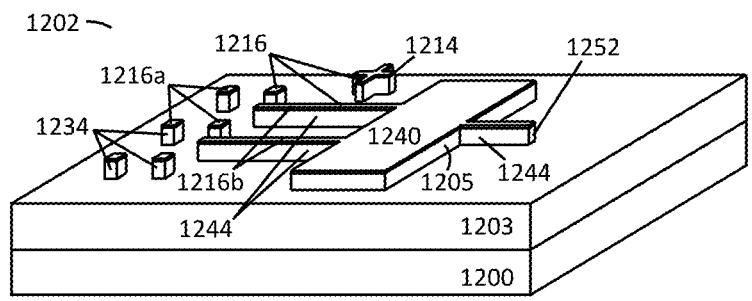

FIG. 12C: Pattern the planar waveguides layer to form the planar waveguides 1244, fiducial marks 1214, and alignment pillars 1234, and optionally the optical devices 1240 (Step 1182b)

FIG. 12

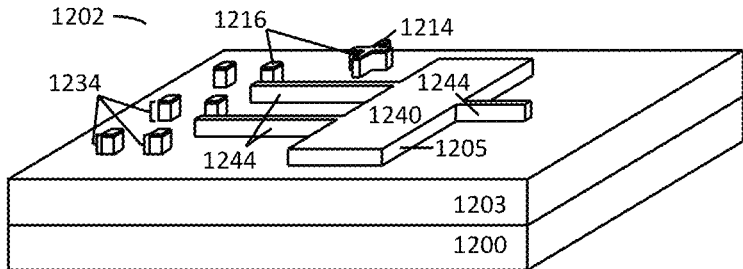

FIG. 12D: Remove the hard mask layer 1216 from the planar waveguides 1244 and optionally from features in the optical devices 1240 (Step 1182c)

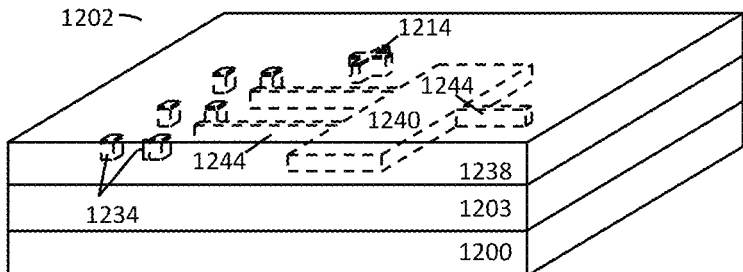

FIG. 12E: Form a thick dielectric layer 1238 over at least the patterned planar waveguides 1244, the fiducial marks 1214, and the partially formed alignment pillars 1234 (Step 1182d)

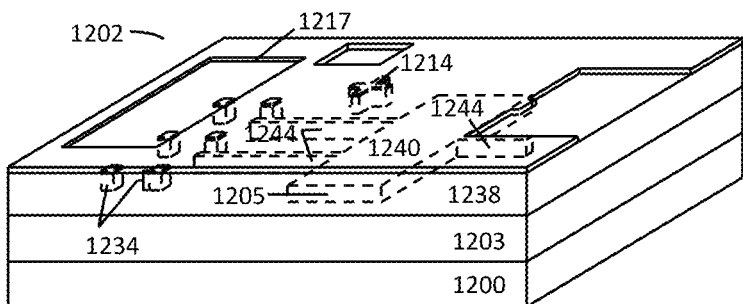

FIG. 12F: Form a patterned hard mask 1217 to facilitate the formation of cavities with alignment pillars 1234, the fiducials 1214, and the optical fiber mounting block 1269

FIG. 12 (continued)

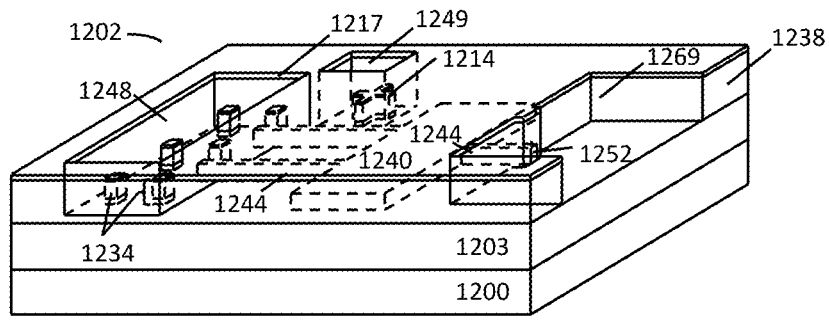

FIG. 12G: Form a cavity 1248 in the thick dielectric layer 1238 that exposes one or more of the partially formed, patterned alignment pillars 1234 to further form the alignment pillars 1234, optionally form a cavity 1249 to expose one or more fiducial marks 1214, and optionally form a cavity 1269 for the attachment of all or a part of one or more fiber optic mounting blocks (Step 1182e)

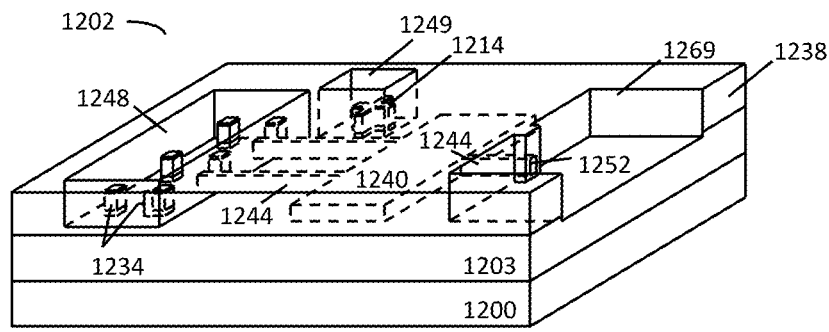

FIG. 12H: Remove hard mask after formation of the cavities 1248, 1249, 1269

FIG. 12 (continued)

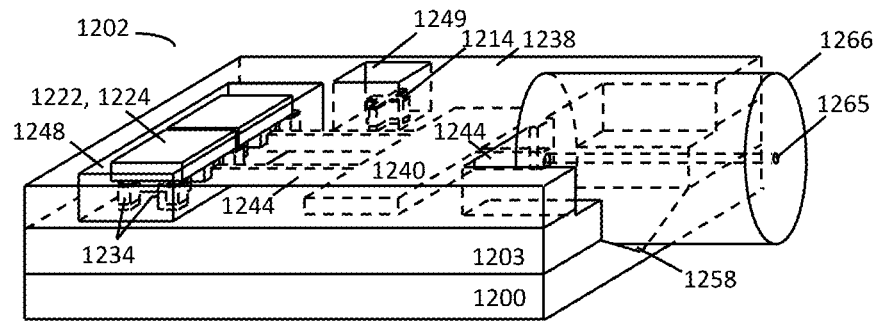
FIG. 12I: Optionally form one or more v-grooves 1258 (Figure shows a portion of a fiber optic cable positioned in the v-groove.)
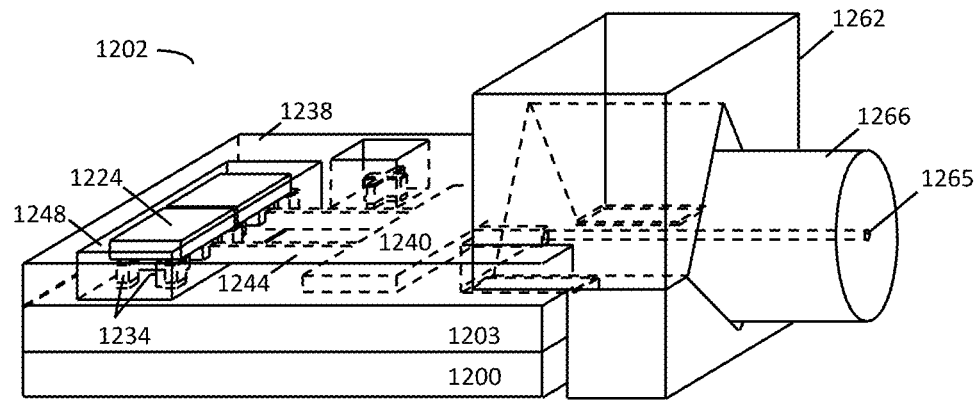
FIG. 12J: Perspective view with portion of fiber optic cable mounted in a fiber optic cable mounting block and with fiber optic cable mounting block positioned on the interposer
FIG. 12 (continued)

LOOPBACK WAVEGUIDE

The present patent application is a continuation of application Ser. No. 17/242,584, filed on Apr. 28, 2021, now U.S. Pat. No. 11,614,584, issued on Mar. 28, 2023, which claims priority from U.S. Provisional Patent Applicant Ser. No. 63/016,532, filed on Apr. 28, 2020, entitled "Loopback Waveguide", of the same inventors, hereby incorporated by reference in its entirety.

FIELD OF THE INVENTION

Embodiments described herein relate to optoelectronic communication systems, and more particularly to a structure for wafer level testing of optical and optoelectronic circuits during the fabrication process.

BACKGROUND

Developments in wafer fabrication processes enable the formation of electrical, optoelectrical, and optical devices on the same substrate. Wafer level testing of optical components in the photonic integrated circuits (PICs) can require a significant allocation of surface area of the PIC die be used for test structures or to interface with off-die test equipment particularly in configurations that utilize v-groove or other edge connections to optical fibers. The formation and placement of optical test structures or structures that allow for the testing of optical devices on the die can lead to undesirable increases in the die area.

Thus, there is a need for PIC test structures and test methodologies that provides for wafer level testing of the electrical, optical, and optoelectrical components of PICs during the fabrication process maximally utilizing the components of the PIC and that do not require extensive use of area on the PIC die.

SUMMARY

Embodiments of testing methodology and structure for wafer level evaluation of photonic integrated circuits are disclosed herein.

Disclosed is a loopback waveguide structure that links the output of one or more optical transmitting devices, or one or more optical transmitting circuits or portions of circuits and the input of one or more optical receiving devices, or one or more optical receiving circuits. In embodiments, the optical transmitting device or circuit and the optical receiving device or circuit provide at least a portion of a photonic integrated circuit (PIC) that comprises optical devices such as waveguides and optoelectrical devices such as lasers and photodiodes, among others. In an embodiment, electrical testing is performed to assess the performance or viability of the photonic circuits on a wafer substrate, prior to singulation and die separation. The electrical testing utilizes a wafer probing apparatus that provides an electrical signal to contact pads connected to electrical or optoelectrical devices within the PIC to be tested.

In an embodiment, a method is described of forming a first optoelectronic circuitry that generates an optical signal, a second optoelectronic circuitry that receives an optical signal, and a loopback waveguide that connects the output from the first optoelectronic circuitry to the second optoelectronic circuitry. Additionally, the connected circuits, together comprising a photonic integrated circuit, are electrically tested using electrical signals that are provided via probing contact pads on the PIC die. Electrical activation of the optoelectrical sending devices and the subsequent detection and measurement of the optical signals in the receiving devices, in embodiments, provides information on the operability or functionality of the PIC on the die at the wafer level, prior to die separation or singulation, using the electrical and optical components of the PIC circuit.

In another embodiment, the loopback waveguide is located on a portion of a neighboring die. In yet another embodiment, the loopback waveguide is located on a portion of a neighboring die and the waveguide is integrated within or around features on the neighboring die. Placement of the loopback waveguide structure, in some embodiments, on neighboring die, facilitates the conservation of valuable surface area of the die upon which the devices are being formed while providing accessibility to the input and output waveguides to which optical fibers are ultimately to be mounted or connected.

In yet another embodiment, the loopback waveguide and the waveguides that interconnect optical and optoelectrical devices and components in the PIC are patterned from an interposer structure comprising a stack of dielectric layers, such as SiON layers, on a substrate. In some embodiments, the multi-layer stack waveguides, e.g., the loopback waveguide and the interconnected waveguides, are thickness matched to the diameter of a single mode fiber core, often used in applications in which the PIC is connected to optical fiber cables for transmission outside of the PIC, for receiving of signals from outside the PIC, or both. Thickness matching of the planar dielectric waveguide layer to the single mode fiber core can eliminate or minimize the requirements for alignment of the fiber core to the planar waveguide layer. In applications in which embodiments utilize the thickness matched planar waveguide layer, wafer level electrical testing allows for an evaluation of the sending and receiving devices from within the PIC prior to completion of the fabrication of the PIC and the subsequent die separation and singulation.

Additional features and embodiments that enable on-wafer testing of optoelectrical devices, optical devices, and both electrical and optical interconnects, prior to die separation, and the corresponding reduction in manufacturing costs associated with wafer level functionality and reliability testing are described herein.

BRIEF DESCRIPTION OF THE DRAWINGS

FIG. 1A Substrate 100 with photonic integrated circuit (PIC) die 102, FIG. 1B. Enlarged schematic view of PIC die with electrical interface 112, sending circuit 106, receiving circuit 108, and loopback waveguide 150, and FIG. 1C electrical test probe head 162 connected to parametric tester 160 positioned over wafer 100 of PICs 102.

Figure 2A:
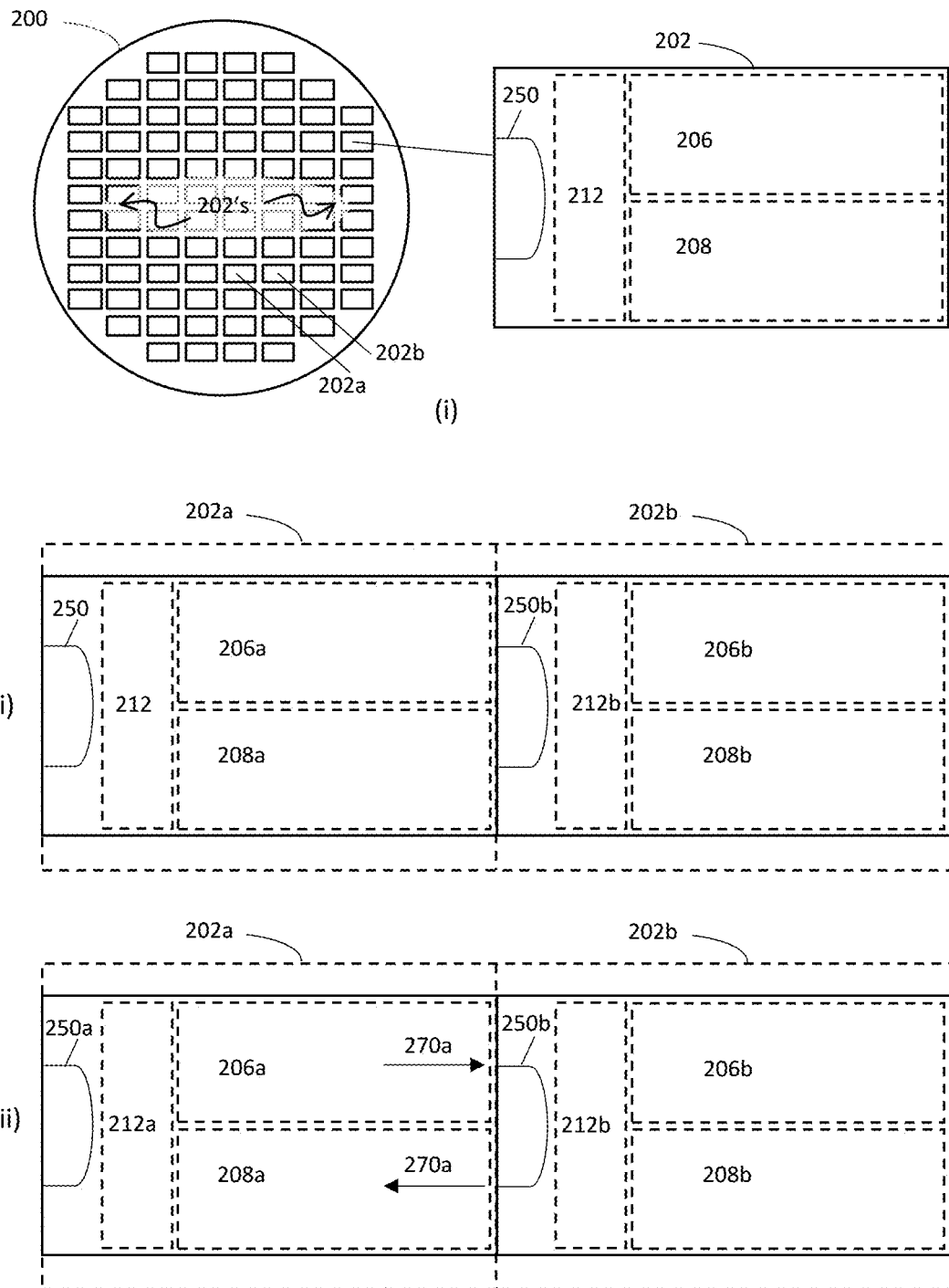
FIG. 2A. (i) Substrate 200 with photonic integrated circuit (PIC) die 202, (ii) schematic drawing of an example PIC die 202a with sending circuit 206a and receiving circuit 208a that are interconnected with an optical path via loopback waveguide 250b that resides on neighboring die 202b, (iii) schematic drawing of example PIC die 202a with sending circuit 206a and receiving circuit 208a that are interconnected with an optical path via loopback waveguide 250b that resides on neighboring die 202b and neighboring PIC die 202b with loopback waveguide 250b; optical signal 270a is also shown.

302a, 302b, (ii) schematic drawing of an example PIC die 302a with neighboring die 302b each having loopback waveguides 350a, 350b, respectively, (iii) schematic drawing of PIC die 302a having loopback waveguide 350a and neighboring PIC die 302b shown with optical signals 370.

Figure 3A:
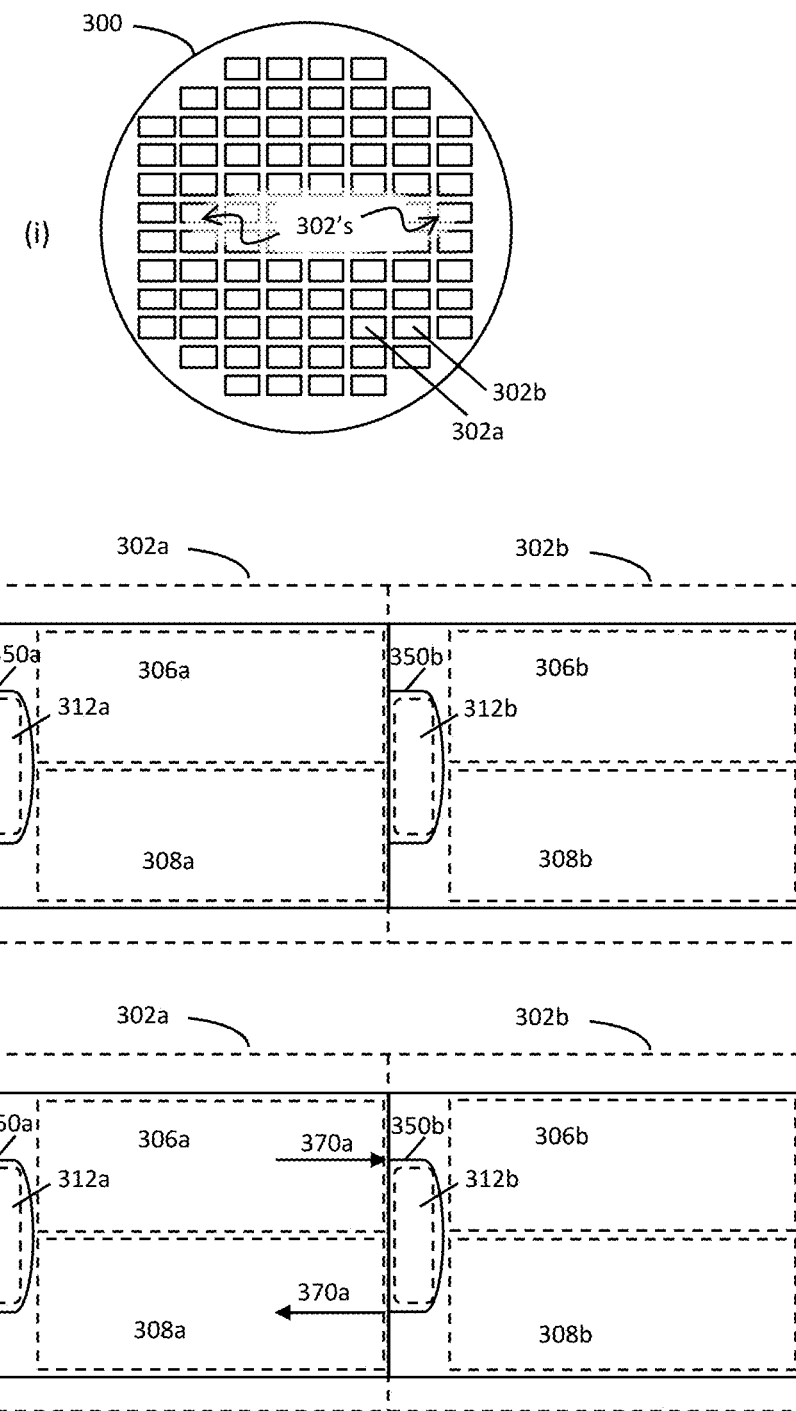
FIG. 3A. (i) Substrate 300 with photonic integrated circuit (PIC) die 302 that includes the example neighboring die
Figure 3B:
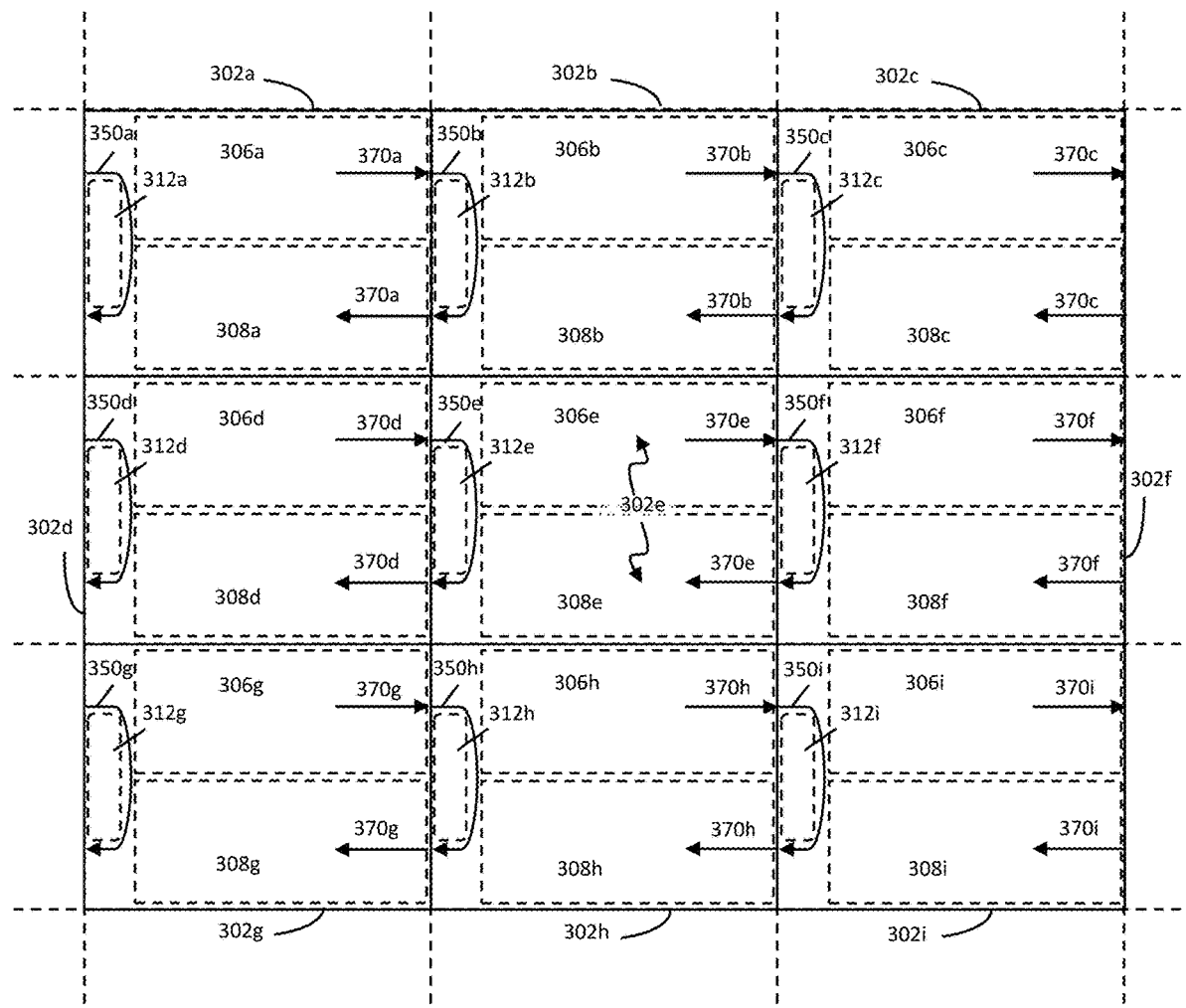

FIG. 3B. An embodiment of an array of PIC dies 302a-302i with loopback waveguides 350a-350i and optical signals 370a-370i.

FIG. 4A-4E. Embodiments of PICs 402a showing integrated loopback waveguides 450b in example neighboring PICs 402b.

Figure 5:
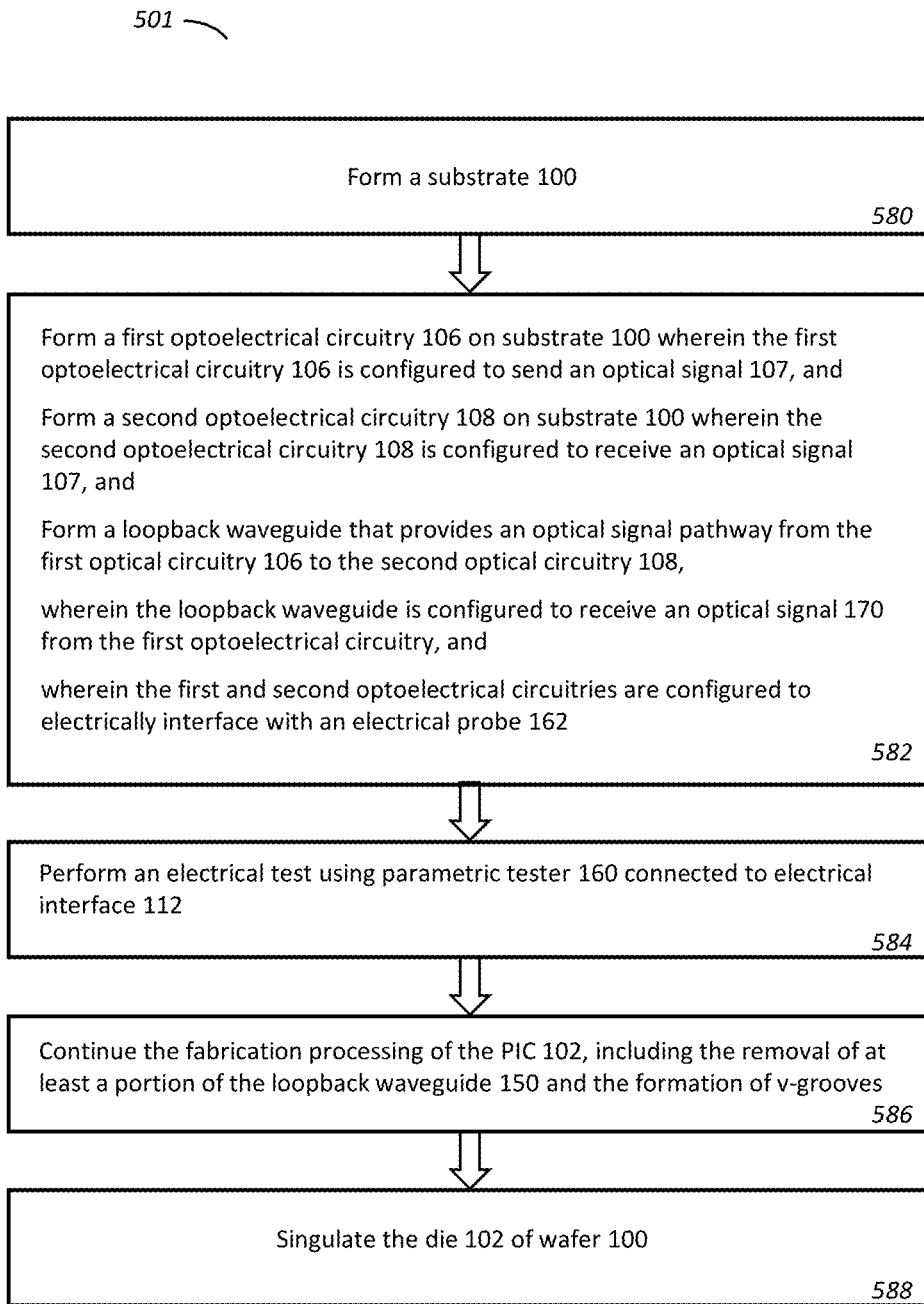

FIG. 5. Process Flow Chart.

FIG. 6A. An embodiment of PIC die 602a with a first optoelectrical circuitry 606a that contains a sending device 622a, a second optoelectrical circuitry 608a that contains a receiving device 624a, and a loopback waveguide 650b that connects the first and second optoelectrical circuitries 606a, 608a and that is located on a portion of the neighboring die 602b: (i) top view and (ii) side view.

Figure 6B:
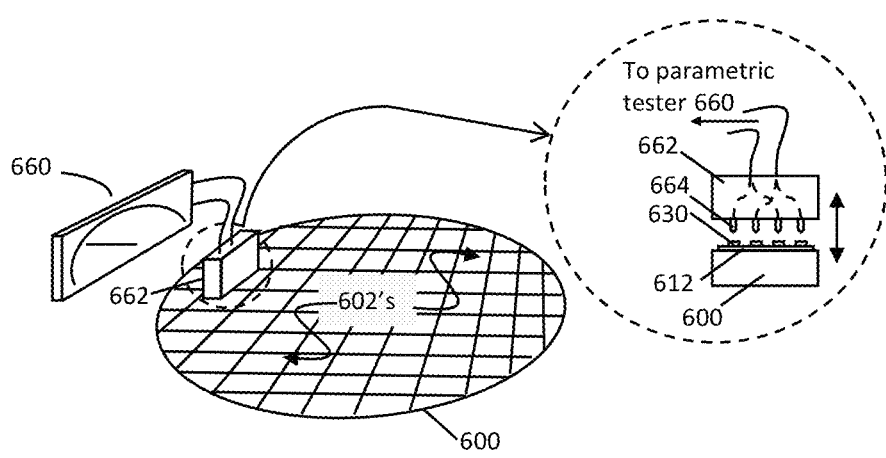

FIG. 6B. Embodiment of an electrical testing configuration with probe head 662 and probe contacts 664 that connect to electrical contact pads 630 on the electrical interface 612 of the PIC die 602.

Figure 6C:
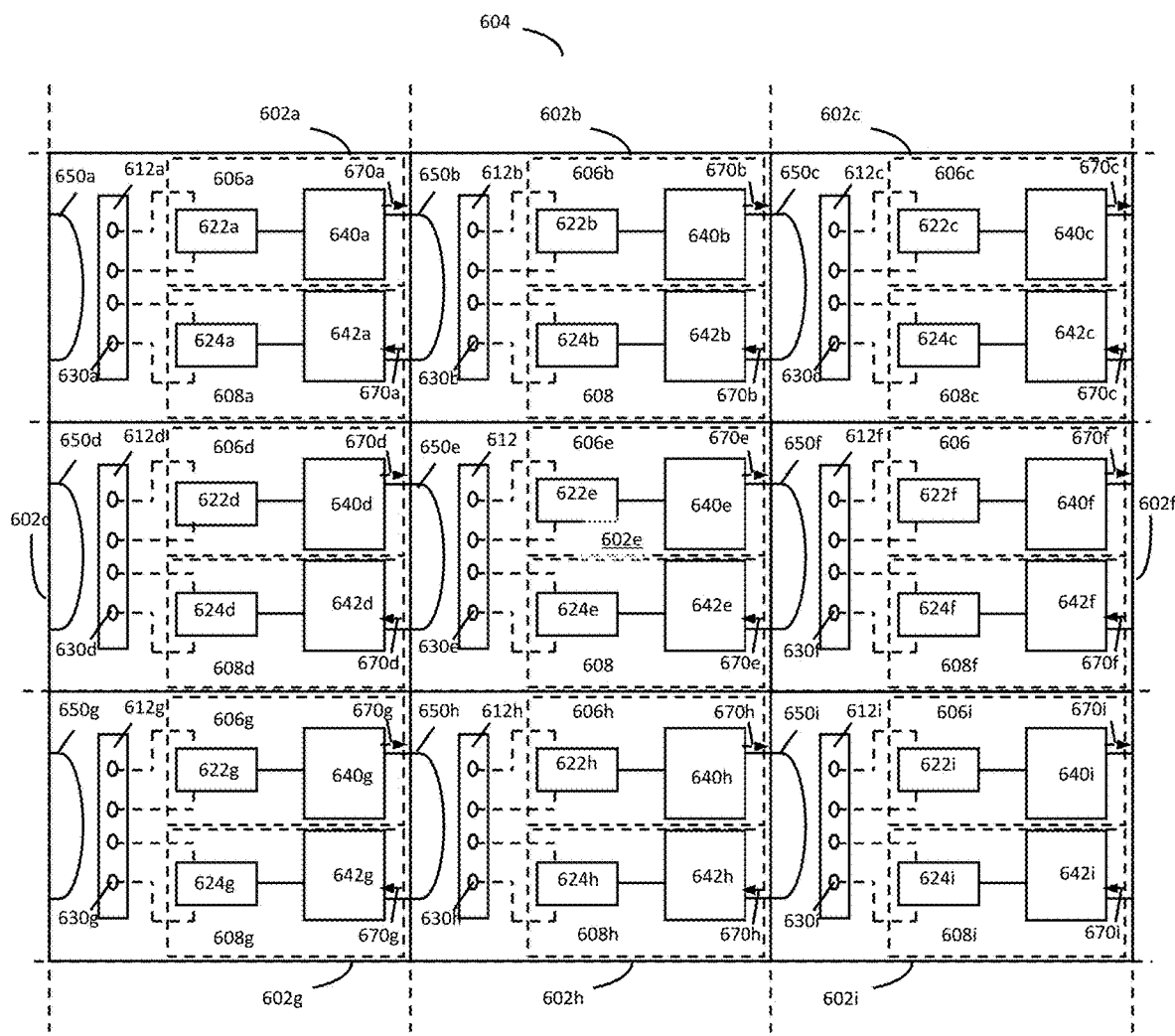

FIG. 6C. an embodiment of an array 604 of PIC die 602a-602i that show the relative positions of an embodiment of the loopback waveguides 650a-650i that are used to test the circuits that reside on neighboring die.

FIG. 7A. An embodiment of PIC die 702a with a first optoelectrical circuitry 706a that contains a sending device 722a, a second optoelectrical circuitry 708a that contains a receiving device 724a, and a loopback waveguide 750b that connects the first and second optoelectrical circuitries 706a, 708a and that is that is integrated within the neighboring die 702b; (i) top view and (ii) side view.

Figure 7B:
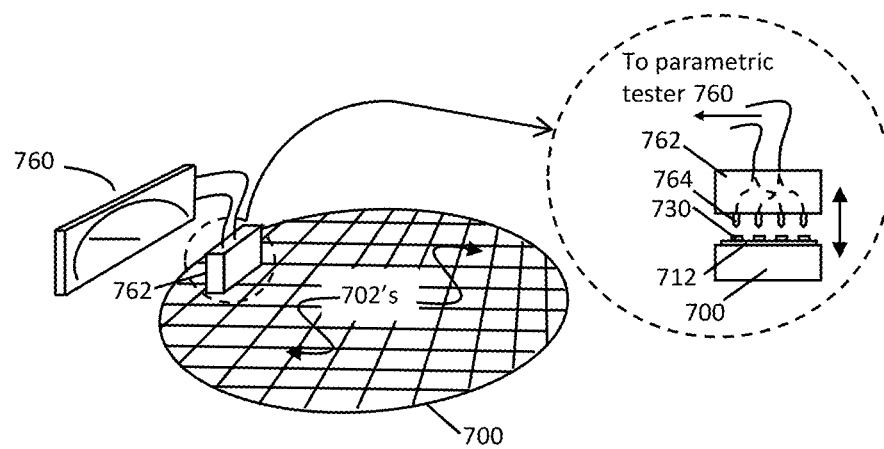

FIG. 7B. Embodiment of an electrical testing configuration with probe head 762 and probe contacts 764 that connect to electrical contact pads 730 on the electrical interface 712 of the PIC die 702.

Figure 7C:
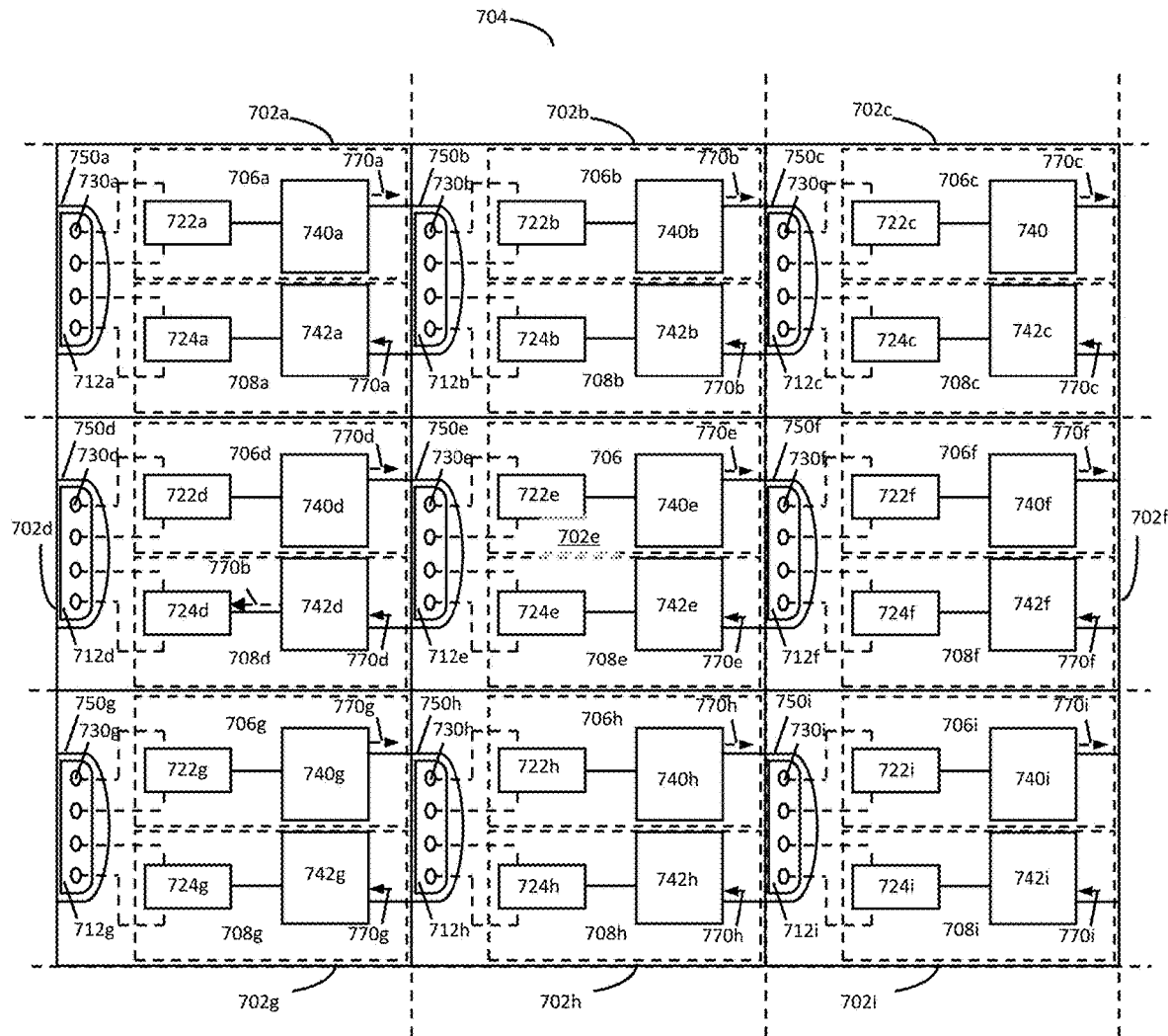

FIG. 7C. An embodiment of an array 704 of PIC die 702a-702i that show the relative positions of an embodiment of the loopback waveguides 750b that are used to test the circuits that reside on the neighboring die.

FIG. 8A-8E. Process flow for the fabrication of a PIC 802 that includes a loopback waveguide 850.

FIG. 9A an embodiment of a wafer level electrical testing apparatus with electrical probe head 962, FIG. 9B an array of PIC die 902 that have electrical test interfaces 912, and FIG. 9C an embodiment of a PIC die 902a that shows a first optoelectrical circuitry 906a that contains a sending device 922a, a second optoelectrical circuitry 908a that contains a receiving device 924a, and a loopback waveguide 950b on neighboring die 902b that connects the first and second optoelectrical circuitries for electrical and optical testing.

FIG. 10. Schematic illustration of an embodiment of an optical fiber that mounts in a v-groove 1058 that is formed at the edge of a PIC die 1002 showing the direct coupling of the core of a mounted fiber optic cable 1057; in this embodiment, the core is substantially matched in size to the mating planar waveguide of the PIC die 1002: FIG. 10A perspective drawing, and FIG. cross section.

Figure 11:
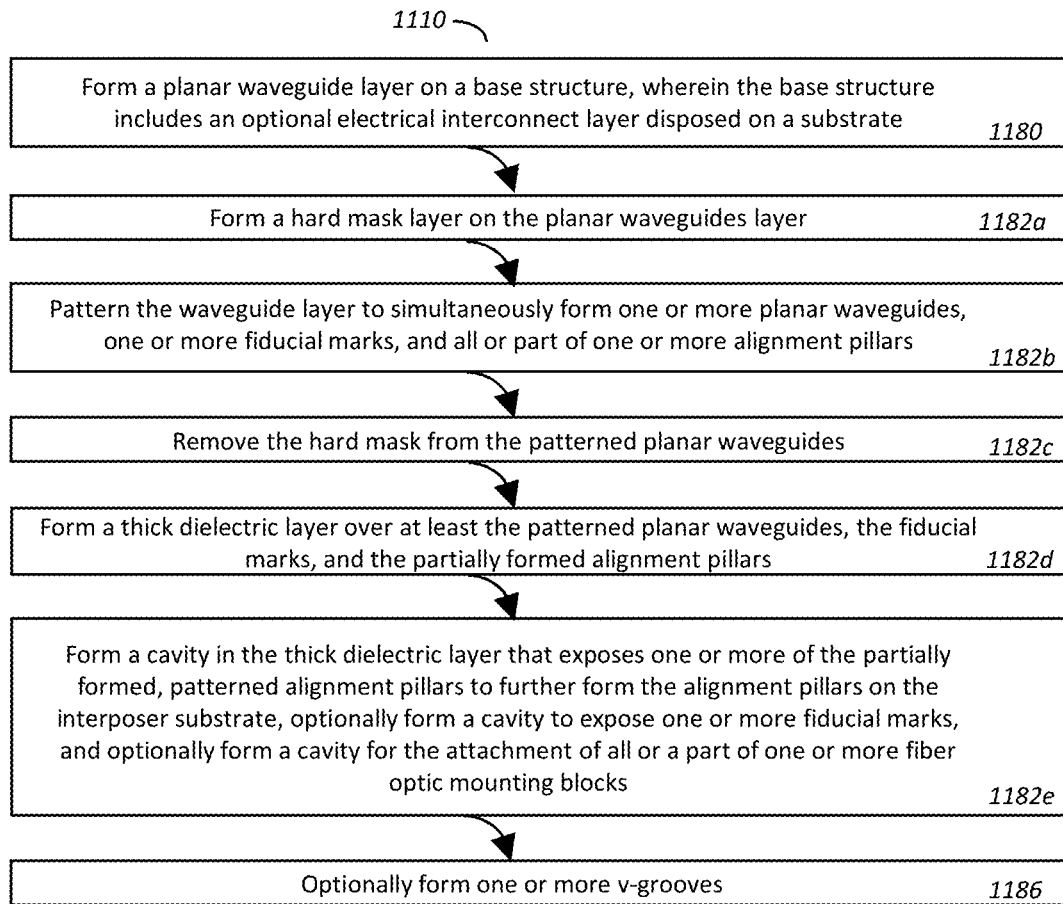

FIG. 11. Method for forming an interposer substrate with mounted device.

FIG. 12A-12J. Sequence of drawings showing the fabrication of an embodiment of an interposer.

Figure 13A:
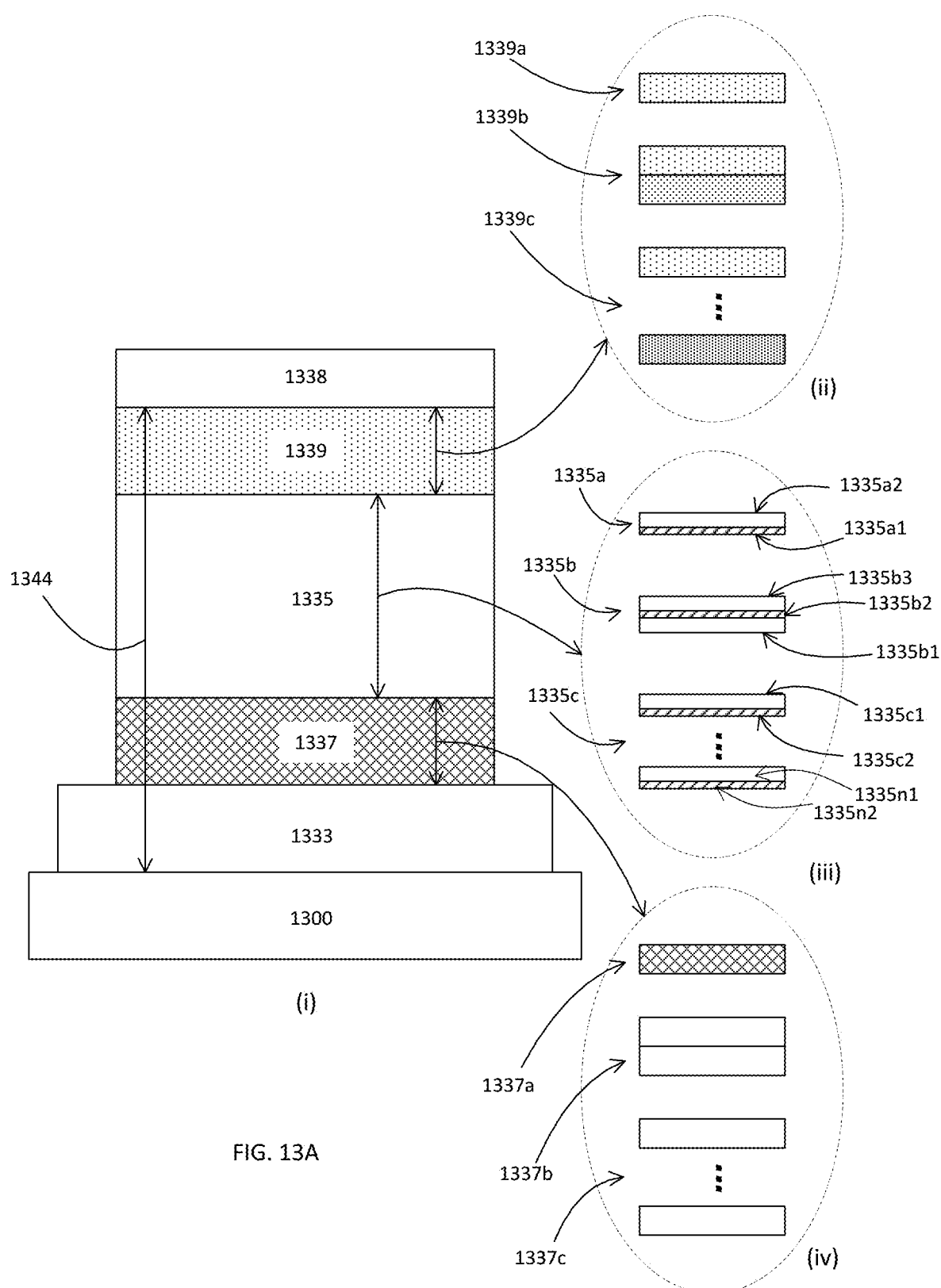

FIG. 13A. An embodiment of a waveguide structure that can be used to form the loopback waveguide structure.

Figure 13B:
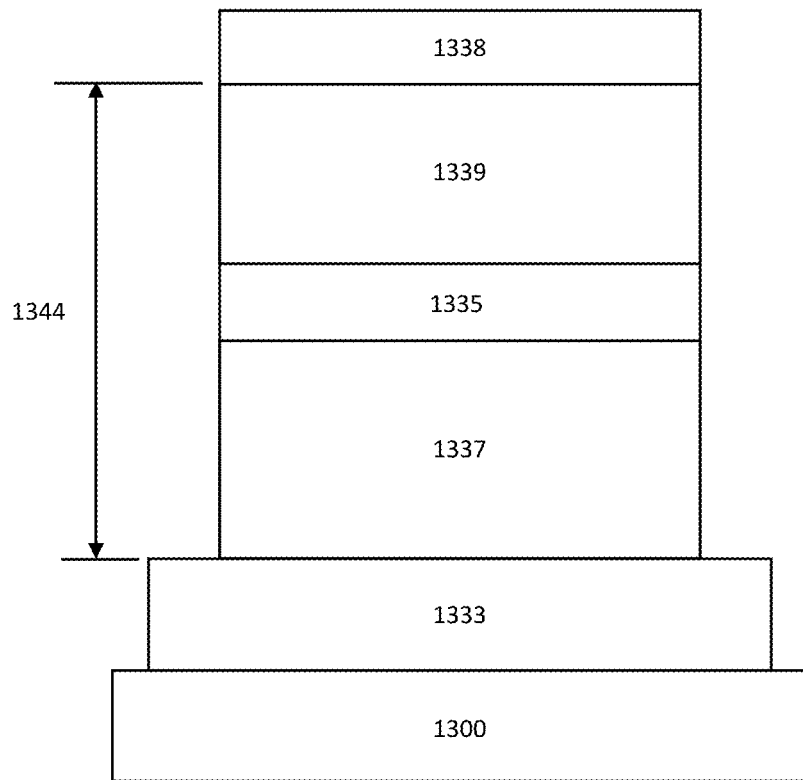

FIG. 13B. Another embodiment of a waveguide structure that can be used to form the loopback waveguide structure.

Figure 14:
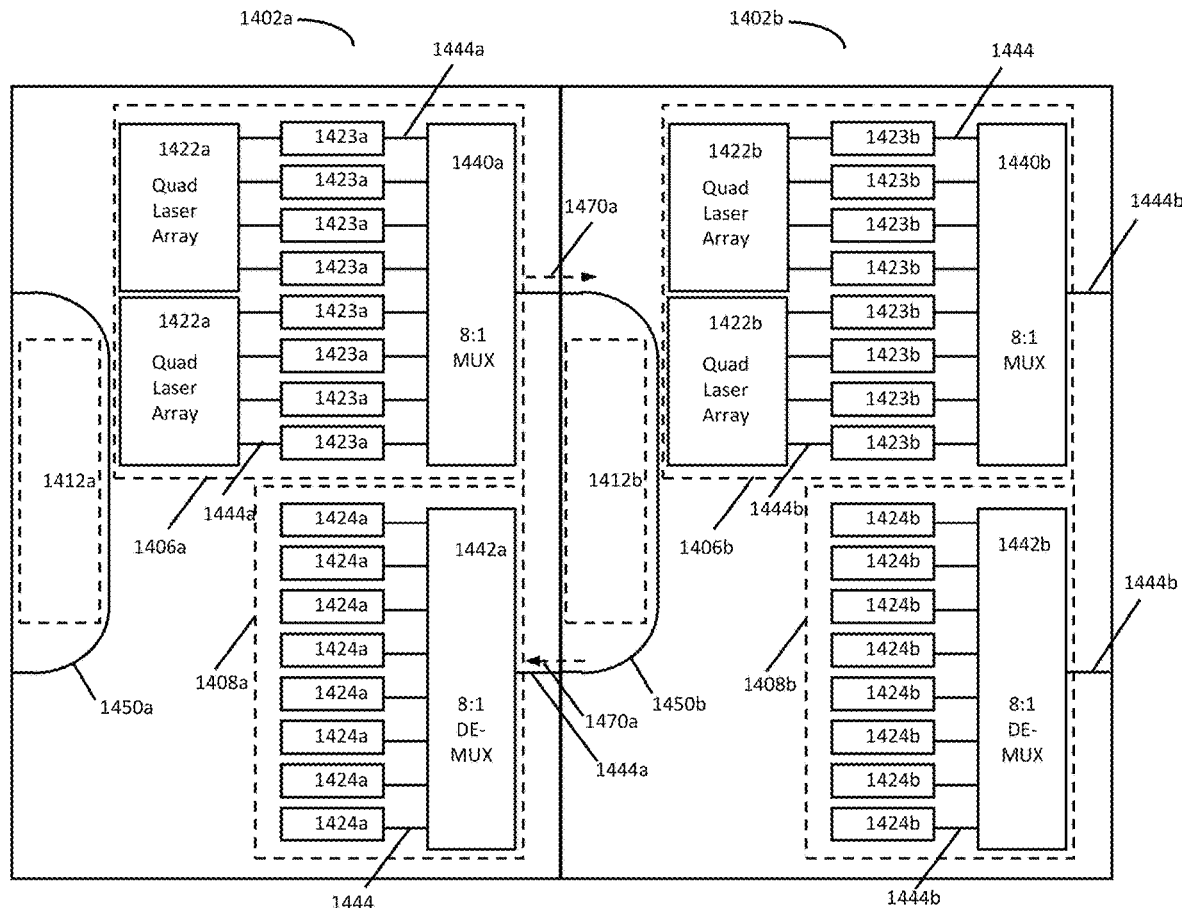

FIG. 14. Schematic drawing of an embodiment of a photonic integrated circuit 1404 configured for multiple channels of sending devices 1422 in sending circuit 1406 and receiving devices 1424 in receiving circuit 1408. Loopback waveguide 1450 connecting output of the sending circuit 1406 and the input of the receiving circuit 1408 is also shown.

DETAILED DESCRIPTION OF EMBODIMENTS

Various embodiments, of the present invention will be described more fully herein with reference to the accompanying drawings. This invention may be, however, embodied in many different forms and should not be construed as limited to the embodiments described herein but rather that the embodiments described are intended to convey the scope of the invention to those skilled in the art. Accordingly, the present invention is not limited to the relative sizes and spacings illustrated in the accompanying figures. It should be understood that a "layer" as referenced herein may include a single material layer or a plurality of layers. For example, an "insulating layer" may include a single layer of a specific dielectric material such as silicon dioxide, or may include a plurality of layers such as one or more layers of silicon dioxide and one or more other layers such as silicon nitride, aluminum nitride, among others. The term "insulating layer" in this example, refers to the functional characteristic layer provided for the purpose of providing the insulation property, and is not limited as such to a single layer of a specific material. Similarly, an electrical interconnect layer, as used herein, refers to a composite layer that includes both the electrically conductive materials for transmitting electrical signals and the intermetal and other layers required to insulate the electrically conductive materials. An electrical interconnect layer may include a patterned layer of electrically conducting material such as copper or aluminum as well as an intermetal dielectric material such as silicon dioxide, and spacer layers above and below the electrically conductive materials, for example, among other layers. Additionally, references herein to a layer formed "on" a substrate or other layer may refer to the layer formed directly on the substrate or other layer or on an intervening layer or layers formed on the substrate or other layer. Like numbers in drawings refer to like elements throughout, and the various layers and regions illustrated in the figures are illustrated schematically.

Testing of photonic integrated circuits that include devices that send and receive optical signals, such as optical transceivers, can benefit from the use of testing methodologies that use optical signals from the sending portion of the transceiver to assess the performance of the receiving portion of the transceiver. Transceivers typically interface with other optoelectrical devices using optical fibers mounted at the edges of the PICs. The optical fibers are commonly attached to the PICs via v-grooves formed at the edge of the wafer, but the attachment of the fibers into the v-grooves can typically only be accomplished after the formation of the v-groove, and after the singulation and packaging of the PIC. Wafer level test structures and methodologies that enable testing of the devices prior to v-groove formation are thus preferred.

In FIG. 1A, an embodiment is shown of a wafer 100 comprised of a plurality of photonic integrated circuits (PIC) 102 that are separated by scribe lines 104. After completion of the front end, wafer processing fabrication steps, the PICs 102 are typically subjected to a singulation process within which the wafer 100 is diced into individual die, for example, by separating the PICs through the scribe lines 104. PICs 102 occupy a portion of wafer 100 and can include, for example, optical devices such as waveguides, multiplexers, demultiplexers, arrayed waveguides, and gratings, and optoelectrical devices such as lasers, photodiodes, and photodetectors, among others.

In FIG. 1B, PIC die 102 from wafer 100 is shown in which functional portions of an embodiment of a PIC die 102 are identified. In the example embodiment shown in FIG. 1B, the PIC die 102 contains a first optoelectrical circuit 106 within which one or more sending devices, such as a laser, for example, is formed. The first optoelectrical circuit 106 can include optical devices, such as waveguides, and electrical devices, such as signal processing devices, in addition to optoelectrical devices. The PIC die 102 also contains a second optoelectrical circuit 108 within which, one or more receiving devices, such as a photodiode, for example, is formed. The second optoelectrical circuit 108 can include optical devices, such as waveguides, and electrical devices, such as signal processing devices, in addition to optoelectrical devices. Electrical contacts to the optoelectrical devices and electrical devices in the first optoelectrical circuit 106 and the second optoelectrical circuit 108 are formed in electrical interface 112. Alternatively, the electrical contacts can be disposed within the areas of the first and second optoelectrical circuits 106, 108, respectively. A loopback waveguide 150 is formed that connects a waveguide from the first optoelectrical circuit 106 to a waveguide from the second optoelectrical circuit 108.

Optical signals are formed in one or more sending devices and these optical signals propagate from sending circuit 106 to the loopback waveguide 150, and to the receiving circuit 108 of PIC 102. In embodiments, the optical loopback waveguide 150 receives the optical signal 170a from sending portion 106 and directs this signal to receiving portion 108 of PIC die 102. The optical signal from the sending circuit 106, in some embodiments, simply propagates through the loopback waveguide 150 to the receiving portion 108. In other embodiments, the optical signal is processed, converted, or modified in some form prior to being received by receiving portion 108 of PIC die 102.

Referring to FIG. 1C, a schematic of wafer 100, with a plurality of PIC die 102, is shown in proximity to electrical probe head 162 to illustrate an example of a wafer level electrical test configuration. In the inset of FIG. 1C, an enlarged schematic of the probe head 162 with electrical probing contacts 164 is shown in alignment with electrical contact pads 130 in the electrical interface 112 of the PIC die 102 on wafer 100. The electrical probe head 162 connects to parametric tester 160. In the embodiment shown in FIG. 1C, the electric probe head 162 is shown in an embodiment with four probe tips 164 that interface with probing pads 130 on PIC die 102. In other embodiments, more or less than four probe tips may be used to electrically interface the parametric tester 160 to the electrical probe contacts 130 of the PIC die 102.

Figure 2B:
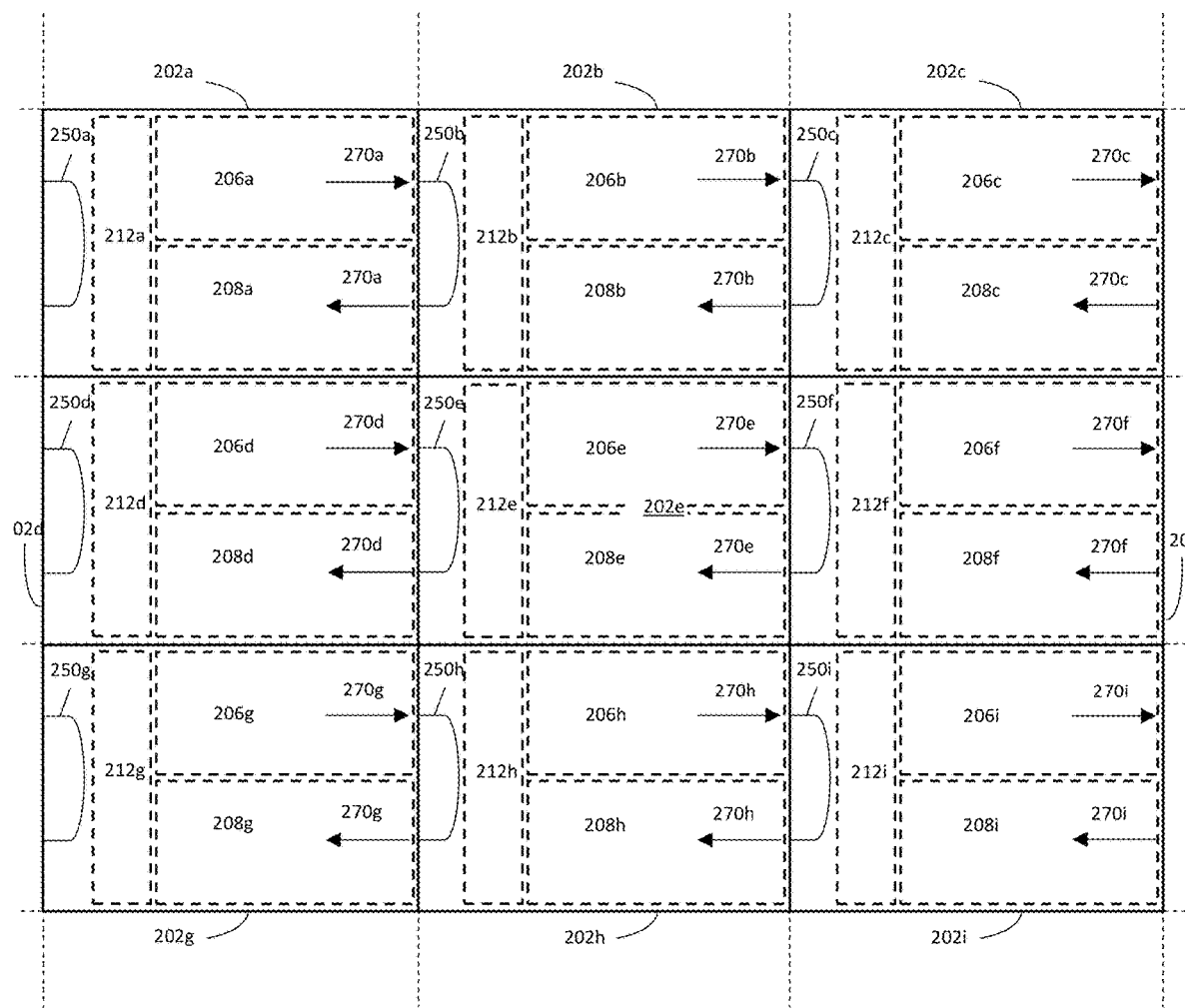
FIG. 2B. An embodiment of an array of PIC die 202a-202i with loopback waveguides 250 and optical signals 270.

Referring to FIGS. 2A and 2B, drawings are shown that illustrate some features of embodiments. In FIG. 2A(i), a schematic of a wafer 200 is shown with a plurality of PIC die 202 that include an example of two neighboring die 202a, 202b. PIC die 202, including the two example neighboring die 202a, 202b, of wafer 200 have optoelectronic integrated circuits that include optical sending circuit 206 and receiving circuit 208. In embodiments, neighboring die 202a, 202b share a common edge and are formed in the embodiment shown in FIG. 2A in the same row of die within the plurality of rows of PIC die 202 as further discussed herein. Loopback waveguide 250 traverses the common edge between the two neighboring die.

The loopback waveguide is a waveguide that provides an optical pathway between the sending circuit 206 and the receiving circuit 208 of PIC die 202. The loopback waveguide that provides an optical pathway between the sending circuit 206 and the receiving circuit 208 of an optical die 202a, for example, can, in embodiments, reside on a neighboring die as further described herein.

In FIG. 2A(ii), elements of an embodiment of two neighboring PIC die 202a, 202b are illustrated. Each of the two neighboring die 202a, 202b, are shown with circuit elements that include a sending circuit 206, a receiving circuit 208, an electrical interface 212, and a loopback waveguide 250. Additional electrical, optical, optoelectrical, and other types and combinations of circuit elements may be present in addition to these circuit elements. The loopback waveguide 250 occupies a portion of each die, as shown in the embodiment illustrated in FIG. 2A(ii) for die 202b, and are used in the assessment of the performance or functionality of the neighboring die to which the loopback waveguide is connected, as for example, the die 202a shown to the immediate left of die 202b.

This point is further clarified in the illustration and labeling of the embodiment shown in FIG. 2A(iii). Each of the two neighboring die 202a, 202b, are shown in FIG. 2A(iii) with identified circuit elements. Die 202a includes the sending circuit 206a, a receiving circuit 208a, an electrical interface 212a, and loopback waveguide 250a. Similarly, die 202b includes sending circuit 206b, receiving circuit 208b, electrical interface 212b, and loopback waveguide 250b. The loopback waveguides 250a, 250b for die 202a, 202b, respectively, occupy a portion of each die 202a, 202b, respectively, as shown. In the embodiment in FIG. 2A(iii), the loopback waveguide 250b structure is provided to enable use of this waveguide to assess a measure of performance or functionality of PIC die 202a.

In practical operation, an optical signal 270 originates from one or more sending devices from sending circuit portion 206a of the PIC 202a and is initiated with the application of an electrical signal to electrical interface 212a. Optical signal 270 propagates from the sending circuit portion 206a, through the loopback waveguide 250b that resides on the neighboring die 202b, and this optical signal 270 is received in one or more optical or optoelectrical devices in receiving circuit portion 208a of the PIC 202a. In embodiments, the optical signal 270 that originates in the sending portion 206a is the same optical signal 270 that is received in the receiving portion 208a of the PIC 202a having propagated through the loopback waveguide 250b of the neighboring die 202b. In some embodiments, the optical signal may be altered, intentionally or unintentionally, by the loopback waveguide 250b. The optical signal 270 may, for example, be subjected to attenuation or signal loss. Or, for example, the optical signal 270 may be altered as a result of an interaction with an optical device encountered during propagation.

In the embodiment shown in FIG. 2A(iii), the loopback waveguide 250b resides on the neighboring die 202b, as shown, adjacent to the die 202a for which the loopback waveguide 250b is used to provide a functionality assessment or other measure of performance. That is, the waveguide 250b on die 202b is used in the testing of the die 202a that is shown immediately to the left of 202b as shown in the embodiment in FIG. 2A(i). Loopback waveguide 250b is used in the evaluation of the functionality of the neighboring die 202b, in the embodiment shown, through the formation of a connective optical path that connects a waveguide from the sending portion 206a of PIC die 202a, to the receiving portion 208a of PIC die 202a. The presence of the loopback waveguide 250b on neighboring die 202b, provides an optical link that enables the capability for testing of the optoelectrical circuits 206a, 208a on die 202a, and the positioning of this loopback waveguide 250b, for example, on the neighboring die allows for efficient use of available die surface area and increased flexibility for subsequent PIC die separation processing for the wafer die 202a, 202b (along with the other die 202 of wafer 200). The optical link provided by the loopback waveguide 250b enables all or a portion of the sending circuit 206a of the PIC 202a to be used to generate the optical test signal 270, and all or a portion of the receiving circuit 208a of the PIC 202a to be used to detect the optical signal 270 in the assessment of the operational performance of the PIC 202a.

Die separation is a necessary step in the fabrication process for the manufacturing of the PICs. In embodiments in which the loopback waveguide 250b, for example, which is used in the evaluation of die 202a, is positioned on the neighboring die 202b, the die separation process can be performed in a scribe line between the neighboring die 202a, 202b. Additionally, the loopback waveguide can be efficiently placed in the neighboring die 202b such that the impact of its presence on die 202b can be minimized. Configurations for the loopback waveguide can be devised that provide minimal impact on the use of surface area on the neighboring die.

The loopback waveguide 250a shown in FIG. 2A(iii), although residing on PIC die 202a, is used in embodiments, for the testing of the PIC die that is shown immediately to the left of the PIC die 202a as shown in FIG. 2A(i). Each PIC die 202 to be tested requires a loopback waveguide on the neighboring die, although not all die on a wafer are tested in all embodiments. In embodiments, one PIC die 202 on wafer 200 has a loopback waveguide 250 on a neighboring die, positioned to provide for the testing of the sending circuit 206 and the receiving circuit 208 of this die. In other embodiments, more than one PIC die on wafer 200 have loopback waveguides 250 on their neighboring die positioned to provide for functionality testing of these die.

In FIG. 2A(iii), the scribe line between the die 202a and die 202b is shown to be positioned between the optoelectrical circuits 206a, 208a and the loopback waveguide 250b of the neighboring die 202b. Thus, the loopback waveguide in one die is configured to function with the circuits in a neighboring die. Alternatively, the scribe line in some embodiments, can be positioned between the loopback waveguide 150 and the electrical interface 112 as shown in FIG. 1(ii). In this example embodiment, in FIG. 1(ii), a scribe line is positioned between the loopback waveguide 150 and the electrical interface 112. Thus, the loopback waveguide in one die is configured to function with the circuits 106,108 on the same die.

In FIG. 2B, a schematic illustration of an array of PIC die 202 of wafer 200 is shown to further illustrate elements of embodiments shown in FIG. 2A. FIG. 2B shows example PIC die 202a-202i from wafer 200 that further illustrate the utilization and relative positioning of the loopback waveguides 250 within this array of example die. The array shows nine PIC dies 202, three die wide by three die high, in which the loopback waveguides 250 on each die receive the optical signals 270 from, and return all or part of these signals back to the neighboring die, as described herein.

FIG. 2B shows loopback waveguides 250b, 250e, and 250h contained within PIC die 202b, 202e, and 202h, respectively, and aligned to receive optical signal 270a, 270d, 270g from all or a portion of the sending circuit 206a, 206d, 206g of PIC die 202a, 202d, and 202g, respectively, as shown. Optical signals 270a, 270d, 270g are optical signals originating from the sender portions 206a, 206d, 206g of the PIC circuitry of PIC die 202a, 202d, and 202g, respectively. The PIC die 202b contains the loopback waveguide 250b that can be used in the evaluation of the functionality of the neighboring die 202a, in the embodiment shown, through the formation of a connective optical path that connects a waveguide from the sending portion 206a of PIC die 202a, to the receiving portion 208a of PIC die 202a. The presence of the loopback waveguide 250b on neighboring die 202b, provides an optical link that enables the capability for testing of the optoelectrical circuits 206a, 208a on die 202a, and the positioning of this loopback waveguide 250b, for example, on the neighboring die allows for efficient use of available die surface area and access to the edges of the die to which optical fibers are to be mounted upon subsequent PIC die separation after fabrication and testing. The optical link provided by the loopback waveguide 250b enables all or a portion of the sending circuit 206a of the PIC 202a to be used to generate the optical test signal 270a, and all or a portion of the receiving circuit 208a of the PIC 202a to be used to detect the optical signal 270a in the assessment of the operational performance of the PIC 202a. Similarly, PIC die 202e contains a loopback waveguide 250e to enable assessment of neighboring PIC die 202d, and PIC die 202h contains a loopback waveguide 250h to enable assessment of PIC die 202g. Similarly, loopback waveguides 250c, 250f, and 250i contained within PIC die 202c, 202f, and 202i, respectively, are configured to receive optical signal 270b, 270e, 270h from PIC die 202b, 202e, and 202h, respectively, as shown. Optical signals 270a-270i originate on the sending portions 206a-206i upon the application of an electrical signal to the electrical interfaces 212a-212i, respectively.

And similarly, loopback waveguides on the die to the immediate right of die 202c, 202f, and 202i are utilized in the testing of all or a portion of the optical sending circuits 206c, 206f, 206i and all or a portion of the optical receiving 208c, 208f, 208i on die 202c, 202f, and 202i. And also, the loopback waveguides 250a, 250d, and 250g, as shown, are utilized in embodiments, for the assessment of the die that are present to the immediate left of these die as shown, for example, in the configuration of die on the substrate 200 shown in FIG. 2A(i). It is important to note that the optical signals 270 in FIGS. 2A and 2B are specific to the die within which the signal is formed and the loopback waveguide 250 through which it propagates in the neighboring die. The propagation of the optical signals 270 in the neighboring die, in embodiments, are typically confined to the loopback waveguide, although additional processing of the signal could be performed on the neighboring die prior to the returning of the optical signal 270 to the receiving circuit 208 of the die being tested.

It should be noted that the sending circuits 206 and receiving circuits 208 of PIC die 202 in FIGS. 2A and 2B are shown schematically, and distinctly, although in practice, the layout on these functional components of the optoelectrical PIC die 202 may not be formed on distinct portions of the die 202 as shown but rather in some embodiments, for example, sending devices from the sending circuit 206 and receiving devices from the receiving circuit 208 may be grouped together as shown in FIGS. 2A and 2B, for example.

Referring to FIGS. 3A and 3B, drawings are shown that illustrate some features of embodiments. In FIG. 3A(i), a schematic drawing of a wafer 300 is shown with a plurality of PIC die 302 that include an example of two neighboring die 302a,302b. PIC die 302, including the two example neighboring die 302a, 302b of wafer 300 have optoelectronic integrated circuits that include optical sending circuit 306 and receiving circuit 308. In embodiments, neighboring die 302a, 302b share a common edge and are formed in the embodiment shown in FIG. 3A in a common row of die within the plurality of rows of PIC die 302 as further discussed herein. Loopback waveguide 350 traverses the common edge between the two neighboring die.

The loopback waveguide is a waveguide that provides an optical pathway between the sending circuit 306 and the receiving circuit 308 of PIC die 302. The loopback waveguide that provides an optical pathway between the sending circuit 306 and the receiving circuit 308 of an optical die 302, for example, can, in embodiments, reside on a neighboring die as further described herein.

In FIG. 3A(ii), elements of an embodiment of two neighboring PIC die 302a, 302b are illustrated. Each of the two neighboring die 302a, 302b, are shown with circuit elements that include a sending circuit 306, a receiving circuit 308, an electrical interface 312, and a loopback waveguide 350. Additional electrical, optical, optoelectrical, and other types and combinations of circuit elements may be present in addition to these circuit elements. The loopback waveguide 350 occupies a portion of each die, as shown in the embodiment illustrated in FIG. 3A(ii) for die 302b, and are used in the assessment of the functionality of the neighboring die to which the loopback waveguide is connected, as for example, the die 302a shown to the immediate left of die 302b. In some embodiments, the loopback waveguides 350 can be integrated within the features or elements of the neighboring die. In the embodiment shown in FIG. 3A(ii), for example, the waveguide 350a is shown to be positioned around electrical interface 312. In other embodiments, the waveguide 350 surrounds or is interlaced with electrical interface 312 or one or more other features or elements of the PIC die 302. In yet other embodiments, the waveguide 350 substantially surrounds all or a portion of the circuitry of the neighboring die.

This point is further clarified in the illustration and labeling of the embodiment shown in FIG. 3A(iii). Each of the two neighboring die 302a, 302b, are shown in FIG. 3A(iii) with identified circuit elements. Die 302a includes the sending circuit 306a, a receiving circuit 308a, an electrical interface 312a, and loopback waveguide 350a. Similarly, die 302b includes sending circuit 306b, receiving circuit 308b, electrical interface 312b, and loopback waveguide 350b. The loopback waveguides 350a, 350b for die 302a, 302b, respectively, occupy a portion of each die 302a, 302b, respectively, as shown.

In the embodiment shown in FIG. 3A(iii), the loopback waveguides 350a,350b are interlaced within the features or elements of the die 302a, 302b, respectively. In the embodiment shown in FIG. 3A(iii), for example, the waveguide 350a is shown to be positioned around the electrical interface 312a. In other embodiments, the waveguide 350a surrounds or is interlaced with electrical interface 312a or one or more other features or elements of the PIC die 302a. In yet other embodiments, the waveguide 350a substantially surrounds all or a portion of the circuitry of the die 302a. In the embodiment in FIG. 3A(iii), the loopback waveguide 350b structure is provided to enable use of this waveguide to assess a measure of performance or functionality of PIC die 302a. In this example, the loopback waveguide 350b to be used in the assessment of PIC die 302a, is interlaced with components of die 302b, and in particular, surround the electrical interface 312b on die 302b.

In practical operation, an optical signal 370 originates from one or more sending devices from sending portion 306a of the PIC 302a and is initiated with the application of an electrical signal to electrical interface 312a. Optical signal 370 propagates from the sending circuit portion 306a, through the loopback waveguide 350b that resides on the neighboring die 302b, and this optical signal 370 is received in one or more optical or optoelectrical devices in receiving circuit portion 308a of the PIC 302a. In embodiments, the optical signal 370 that originates in the sending portion 306a is the same optical signal 370 that is received in the receiving portion 308a of the PIC 302a having propagated through the loopback waveguide 350b of the neighboring die 302b. In some embodiments, the optical signal may be altered by features of the loopback waveguide 350b. The optical signal 370 may, for example, be subjected to attenuation or signal loss. Or, for example, the optical signal 370 may be altered as a result of an interaction with an optical device encountered during propagation.

In the embodiment shown in FIG. 3A(iii), the loopback waveguide 350b resides on the neighboring die 302b, as shown, adjacent to the die 302a for which the loopback waveguide 350b is used to provide a functionality assessment or other measure of performance. That is, the waveguide 350b on die 302b is used in the testing of the die 302a that is shown immediately to the left of 302b as shown in the embodiment in FIG. 3A(i). Loopback waveguide 350b is used in the evaluation of the functionality of the neighboring die 302b, in the embodiment shown, through the formation of a connective optical path that connects a waveguide from the sending portion 306a of PIC die 302a, to the receiving portion 308a of PIC die 302a. The presence of the loopback waveguide 350b on neighboring die 302b, provides an optical link that enables the capability for testing of the optoelectrical circuits 306a, 308a on die 302a, and the positioning of this loopback waveguide 350b, for example, on the neighboring die allows for efficient use of available die surface area and increased flexibility for subsequent PIC die separation processing for the wafer die 302a, 302b (along with the other die 302 of wafer 300). The optical link provided by the loopback waveguide 350b enables all or a portion of the sending circuit 306a of the PIC 302a to be used to generate the optical test signal 370, and all or a portion of the receiving circuit 308a of the PIC 302a to be used to detect the optical signal 370 in the assessment of the operational performance of the PIC 302a.

Die separation is a necessary step in the fabrication process for the manufacturing of the PICs. In embodiments in which the loopback waveguide 350b, for example, which is used in the evaluation of die 302a, is positioned on the neighboring die 302b, the die separation process can be performed through a scribe line between the neighboring die 302a, 302b. Additionally, the loopback waveguide can be efficiently placed in the neighboring die 302b such that the impact of its presence on die 302b can be minimized. In the embodiment shown in FIG. 3A, the loopback waveguide 350b is shown to be routed, for example, between features of the PIC die 302b. In particular, the loopback waveguide 350b is shown surrounding the electrical interface 312b of PIC die 302b, and routed between this electrical interface 312*b* and the first and second optoelectrical circuits 306*b*, 308*b* as shown in FIG. 3A(iii).

The loopback waveguide 350*a* shown in FIG. 3A(iii), although residing on PIC die 302*a*, is used in embodiments, for the testing of the PIC die that is shown immediately to the left of the PIC die 302*a* as shown in FIG. 3A(i). Each PIC die 302 to be tested requires a loopback waveguide on the neighboring die, although not all die on a wafer are tested in all embodiments. In embodiments, one PIC die 302 on wafer 300 has a loopback waveguide 350 on a neighboring die, positioned to provide for the testing of the sending circuit 306 and the receiving circuit 308 of this die. In other embodiments, more than one PIC die on wafer 300 have loopback waveguides 350 on their neighboring die positioned to provide for functionality testing of these die.

In FIG. 3B, a schematic illustration of an array of PIC die 302 of wafer 300 is shown to further illustrate features of embodiments shown in FIG. 3A. FIG. 3B shows example PIC die 302*a*-302*i* that further illustrate the utilization and relative positioning of the loopback waveguides 350 within this array of example die. The array shows nine PIC dies 302, three die wide by three die high, in which the loopback waveguides 350 receive the optical signals 370 from, and return all or part of these signals back to the neighboring die, as described herein.

FIG. 3B shows loopback waveguides 350*b*, 350*e*, and 350*h* contained within PIC die 302*b*, 302*e*, and 302*h*, respectively, and aligned to receive optical signal 370*a*, 370*d*, 370*g* from all or a portion of the sending circuit 306*a*, 306*d*, 306*g* of PIC die 302*a*, 302*d*, and 302*g*, respectively, as shown. Optical signals 370*a*, 370*d*, 370*g* are optical signals originating from the sender portions 306*a*, 306*d*, 306*g* of the PIC circuitry of PIC die 302*a*, 302*d*, and 302*g*, respectively. The PIC die 302*b* contains the loopback waveguide 350*b* that can be used in the evaluation of the functionality of the neighboring die 302*a*, in the embodiment shown, through the formation of a connective optical path that connects a waveguide from the sending portion 306*a* of PIC die 302*a*, to the receiving portion 308*a* of PIC die 302*a*. The presence of the loopback waveguide 350*b* on neighboring die 302*b*, provides an optical link that enables the capability for testing of the optoelectrical circuits 306*a*, 308*a* on die 302*a*, and the positioning of this loopback waveguide 350*b*, for example, on the neighboring die allows for efficient use of available die surface area and access to the edges of the die to which optical fibers are to be mounted upon subsequent PIC die separation after fabrication and testing. The optical link provided by the loopback waveguide 350*b* enables all or a portion of the sending circuit 306*a* of the PIC 302*a* to be used to generate the optical test signal 370*a*, and all or a portion of the receiving circuit 308*a* of the PIC 302*a* to be used to detect the optical signal 370*a* in the assessment of the operational performance of the PIC 302*a*. Similarly, PIC die 302*e* contains a loopback waveguide 350*e* to enable assessment of neighboring PIC die 302*d*, and PIC die 302*h* contains a loopback waveguide 350*h* to enable assessment of PIC die 302*g*. Similarly, loopback waveguides 350*c*, 350*f*, and 350*i* contained within PIC die 302*c*, 302*f*, and 303*i*, respectively, are configured to receive optical signal 370*b*, 370*e*, 370*h* from PIC die 302*b*, 302*e*, and 302*h*, respectively, as shown. Optical signals 370*a*-370*i* originate on the sending portions 306*a*-306*i* upon the application of an electrical signal to the electrical interfaces 312*a*-312*i*, respectively.

And similarly, loopback waveguides on the die to the immediate right of die 302*c*, 302*f*, and 302*i* are utilized in the testing of all or a portion of the optical sending circuits 306*c*, 306*f*, 306*i* and all or a portion of the optical receiving 308*c*, 308*f*, 308*i* on die 302*c*, 302*f*, and 302*i*. And also, the loopback waveguides 350*a*, 350*d*, and 350*g*, as shown, are utilized in embodiments, for the assessment of the die that are present to the immediate left of these die as shown, for example, in the configuration of die on the substrate 300 shown in FIG. 3A(i). It is important to note that the optical signals 370 in FIGS. 3A and 3B are specific to the die within which the signal is formed and the loopback waveguide 350 through which it propagates in the neighboring die. The propagation of the optical signals 370 in the neighboring die, in embodiments, are typically confined to the loopback waveguide, although additional processing of the signal could be performed on the neighboring die prior to the returning of the optical signal 370 to the receiving circuit 308 of the die being tested.

The Loopback waveguides 350 are shown to be routed around the electrical interface 312 and between the electrical interface 312 and the sending and receiving circuits 306, 308 respectively. Routing of the loopback waveguide around and between features can allow for more efficient utilization of the die area in embodiments such as on the PIC die 302 shown in FIG. 3 in comparison to the configuration described in the embodiments shown in FIG. 2.

The formation of v-grooves to accommodate optical fiber connections at the wafer edge are generally not conducive to the inclusion of test structures since any included test structure beyond the edge is by definition not included on the die. That is, if the optical fibers are to connect to the waveguides that terminate at the edge of the die, and the optical fibers themselves are not part of the die, but rather components that are attached at the edge of the die, then any test structures that attach at these same locations would also be positioned off of the die unless positioned within a portion of the v-grooves or in the scribe line between the die. The allocation of area on the neighboring die, however, allows for the edge terminated waveguides of the sending circuit 106 and the receiving circuit 108 to be accommodated by utilizing a limited area within which the radii of the loopback waveguide can be positioned within other features of the die. The inclusion of a loopback waveguide, therefore, can either be positioned on sacrificial area or on the die itself. Inclusion of the loopback within the die, but in a configuration that allows the loopback waveguide to be used in the testing or burn-in of the neighboring die, minimizes the impact on the area at the edge and allows the loopback waveguide to be conveniently integrated within structures that allow for integration. The minimal amount of area necessary to accommodate the loopback waveguide remains, in embodiments, but this areal requirement can be minimized.

Figure 4A:
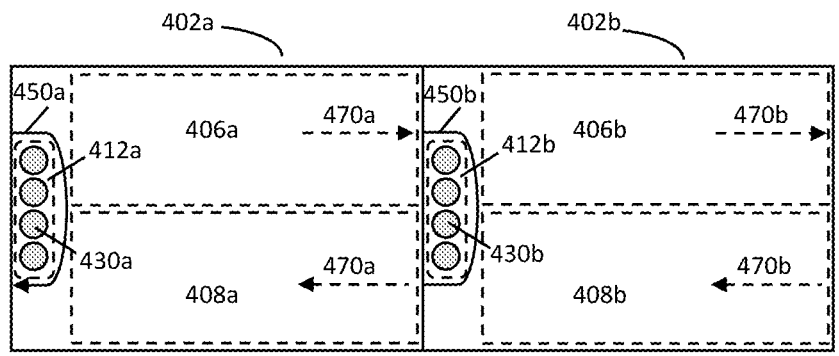

Referring to FIG. 4, illustrations of embodiments of two neighboring PICs 402*a*, 402*b* are shown with example embodiments of the loopback waveguide 450*a*, 450*b* that are routed within and around features of these neighboring PIC die 402*a*, 402*b*. In FIG. 4A, a similar embodiment to that shown in FIG. 3 is shown with electrical contact pads 430 included in the figure for clarity. In this embodiment, the loopback waveguide 450*b* of the PIC die 402*b* can be used to assess the functionality of the neighboring PIC die 402*a*. This loopback waveguide 450*b* occupies a portion of PIC die 402*b*, and is routed around the electrical interface 412. Routing of the loopback waveguide 450*b* within features of the PIC die 402*b* provides a configuration for the waveguide 402*a* that can be diced upon singulation of the die, leaving access to an exposed facet of the waveguide for linking to an optical fiber or other device at the edge of the die 402*a*. The routing of the loopback waveguide 450b can further provide an optical path that is not subjected to sharp bends. The routing of the loopback waveguide can further provide for optical paths that are made of the same waveguide structures as other waveguides on the PIC die 402b, such as a silicon oxynitride waveguide structure used on an interposer. In the embodiment shown in FIG. 4A, the loopback waveguide 450b extends around the electrical interface 412b of PIC die 402b that contains electrical interconnect pads 430b. Optical signal 470a is formed in the sending circuit 406a of the PIC die 402a, propagates through the loopback waveguide 450b in FIG. 4A and is received in receiving circuit 408a of the PIC die 402a.

Figure 4B:
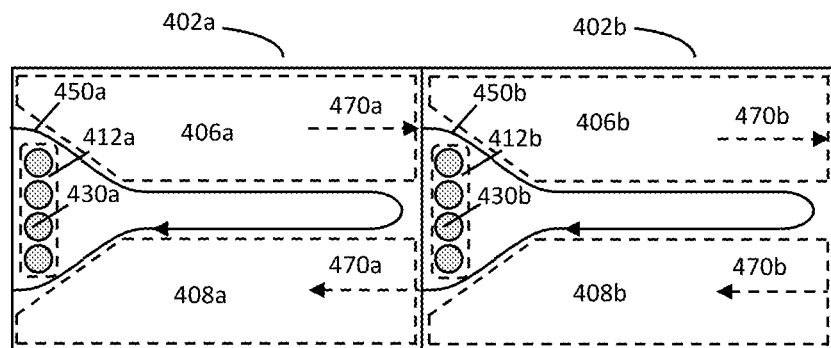

Similarly, in the embodiment shown in FIG. 4B, the loopback waveguide 450b of the PIC die 402b can be used to assess the functionality of the neighboring PIC die 402a. In this embodiment, the loopback waveguide 450b occupies a portion of PIC die 402b. The waveguide 450b shown in FIG. 4(u) is routed around the electrical interface 412b and is further routed into a portion of the die 402b that resides between a sending portion 406b and a receiving portion 408b. Optical signal 470a is formed in the PIC sending portion 406a on the PIC die 402a and propagates to loopback waveguide 450b on neighboring die 402b, and is then received by the receiving portion 408a of PIC die 402a. This embodiment shows further routing of the loopback waveguide 450b within features of the PIC die 402b in comparison to the simple routing around the electrical interface 412b as shown in FIG. 4A.

Figure 4C:
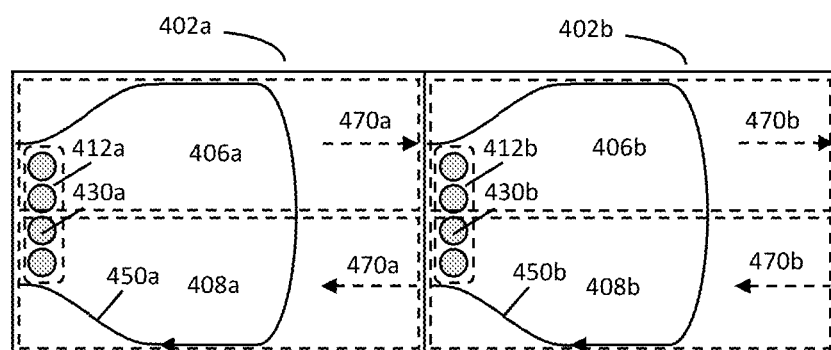

In yet another embodiment shown in FIG. 4C, the loopback waveguide 450b for assessing PIC die 402a, extends around the electrical interface 412b of die 402b and around a portion of the optical sending circuit 406b and the optical receiving circuit 408b of this PIC die 402b, as shown. Optical signal 470a is formed on the PIC die 402a and propagates to loopback waveguide 450b on neighboring die 402b, and is then received by the receiving portion 408a of PIC die 402a.

In yet other embodiments, the loopback waveguide 450b extends around a portion of the receiving circuit 408b. In yet another embodiment, the loopback waveguide 450 extends around a portion of the sending circuit 406b.

In the drawings of the embodiments shown in FIGS. 4A-4C, the electrical interface 412b of PIC die 402b, for example, is shown to occupy a position along the leftmost edge of the PIC die 402b, as shown. In other embodiments, the electrical interface 412b is formed in another location on the PIC die 402b. In the embodiment shown in FIG. 4D, for example, with the electrical interface 412b located at the upper edge of FIG. 4D as shown, the loopback waveguide 450b for assessing PIC die 402a, extends along the upper edge of the neighboring PIC die 402b and around the electrical interface 412b of PIC die 402b. Optical signal 470a is formed in the sending portion 406 of the PIC die 402a, propagates to loopback waveguide 450b on neighboring die 402b, and is then received by the receiving portion 408b of PIC die 402a.

In another embodiment, the electrical test pads 430b are located in multiple locations with one or more test pads in one location, and one or more in one or more other locations within the PIC die 402b. Referring to FIG. 4E, an embodiment is shown in which the electrical contacts 430b are formed in more than one location on the PIC die 402b. One or more of the electrical test pads 430b are located in one location, and one or more are located in one or more other locations within the PIC die 402b. The loopback waveguide 450b used to make an assessment of the functionality or operability of the PIC die 402a, extends around a portion of the electrical interface 412b of the die 402b as shown in the embodiment in FIG. 4E. Optical signal 470a is formed on the PIC die 402a and propagates to loopback waveguide 450b on the neighboring die 402b, and is then received by the receiving portion 408b of PIC die 402a.

In embodiments, the routing of the loopback waveguide 450b that is used to make an assessment of the functionality or operability of the PIC die 402a, can extend around all or a portion of the electrical interface 412b, all or a portion of a sending circuit 406b, and all or a portion of the receiving circuit 408b of the neighboring PIC die 402b. In other embodiments, the loopback waveguide 450b can extend around one or more of none, all, or a portion of the electrical interface 412b, none, all, or a portion of the sending circuit 406b, and none, all or a portion of the receiving circuit 408b of the neighboring PIC die 402b. In the embodiments in which the loopback waveguide 450b is not routed between features of the PIC die 402b, and does not extend around a portion of the electrical interface 412b, a portion of the sending circuit 406b, or a portion of the receiving circuit 408b, the loopback waveguide 450b may simply form a loop at the edge of the neighboring PIC die 402b, as shown for example, in FIG. 1.

Referring to FIG. 5, an embodiment of a method for the fabrication and functional testing of the PIC die 100 and other embodiments as described herein, are provided in process flow 500. In step 580, a substrate 100 is formed. In embodiments, the substrate can be a semiconductor, a ceramic, an insulator, a metal, or a combination of these materials. The substrate can be a semiconductor, an insulator, a metal, or a combination of these materials with additional layers formed on the substrate. The substrate can have, in some embodiments, for example, a metallization layer consisting of one or more layers that includes patterned metals and patterned or unpatterned insulation layer. Following the formation of the substrate 100 in step 580, a first optoelectrical circuitry 106 and second optoelectrical circuitry 108 are formed in step 582 wherein the first optoelectrical circuitry 106 is configured to send an optical signal 170, and the second optoelectrical circuitry 108 is configured to receive an optical signal 170. In addition to formation of the first optical circuitry 106 and the second optical circuitry 108, optical loopback waveguide 150 is also formed in step 582 wherein the loopback waveguide 150 is configured to receive the optical signal 170 from the first optical circuitry 106 and to send the optical signal 170 to the second circuitry 108. This loopback waveguide 150 is configured to couple the first optoelectrical circuit 106 and the second optoelectrical circuit 108 of PIC die 102a, and resides on the neighboring die 102b.

In step 584 of the process flow 500, following the formation of the first optoelectrical circuit 106, the second optoelectrical circuit 108, and the coupling of these first and second optoelectrical circuits 106, 108 with the loopback waveguide 150 on a neighboring die 102b, an electrical test is performed to assess the operability of at least one of the optoelectrical and optical circuit elements contained within the PIC 102a. In an embodiment, the electrical test in step 584 is performed using a parametric tester 160 connected to electrical interface 112 of PIC die 102a.

Following the electrical test performed in step 584, processing of the wafer is continued in step 586 of process 500 to further the fabrication of the wafer 100 and the PICs 102. A portion of the continued processing includes the removal of at least a portion of the loopback waveguide 150 and the formation of v-grooves at the edge of the die 102. V-grooves provide a mechanical socket within which optical fibers are mounted to the PIC 102 for typical applications of optoelectrical circuits. Optical fibers mounted in the v-grooves form the primary pathways for linking the PICs 102 with optical networks. The formation of v-grooves that align with the optical waveguides require the removal of at least a portion of the loopback waveguide 150 as further described herein. Upon completion of the fabrication processes including the formation of the v-grooves, in process flow step 588, the wafer 100 is diced or etched or otherwise processed to singulate the individual die of the wafer 100. Singulation, as used herein, refers to the process of converting the wafer 100, which comprises a plurality of PIC circuits and die 102, into individual die 102. Further processing can include, for example, packaging of the singulated PIC die 102 into individual hermetically sealed packages, and often follows the singulation step.

Referring to FIG. 6, illustrations are shown that further highlight specific features of embodiments. In FIG. 6A(i), a top-down schematic view of neighboring PIC die 602a, 602b are shown. PIC die 602a, 602b are optoelectronic integrated circuits. In FIG. 6A(i), embodiments of the elements of each of the neighboring PIC die 602a, 602b are shown with similar circuit elements. PIC die 602a includes a sending circuit 606a, a receiving circuit 608a, and an electrical interface 612a. In embodiments, the electrical interface 612a has electrical contact pads 630a electrically connected to metallization lines 632a buried within, on, or some combination of buried and unburied layers that connect the electrical contact pads 630a to optoelectrical devices 622a, 624a. Optoelectrical device 622a is comprised of one or more sending devices. A sending device such as device 622a can be a laser or a light emitting diode, or other form of optically emitting device that can form an optical signal from the application of an electrical signal to the device. Optoelectrical device 624a is comprised of one or more receiving devices. A receiving device such as device 624a can be a photodetector, for example, or other form of optical receiving device that can receive an optical signal and convert the optical signal to an electrical signal. Additional electrical, optical, optoelectrical, and other types of devices and circuitry may be present on the die PIC 602a in addition to these circuit elements 606a, 608a, and additional contact pads 630a and electrical connections 632a are present in some embodiments. In some embodiments, waveguides 644a are present to interconnect optical and optoelectrical devices on the PIC die 602a. Multiple sending and receiving circuits are present in some embodiments. (PIC die 602b contains similar features labeled accordingly with the suffix 'b'.)

Also shown in the figure is an embodiment of loopback waveguide 650a, 650b. Loopback waveguide 650a occupies a portion of the PIC die 602a and loopback waveguide 650b occupies a portion of the PIC die 602b as shown in the top-down schematic illustration of the embodiment in FIG. 6A(i). Loopback waveguide 650b, residing on PIC die 650b, is used in the evaluation of the functionality of the die neighboring die 650a as described herein. Similarly, loopback waveguide 650a is used in the evaluation of the functionality of the neighboring die to the immediate left of PIC die 602a (partial die shown). Likewise, the loopback waveguide on the partial die to the right of PIC die 602b shown in FIG. 6A(i) is used to evaluate the functionality of the PIC die 602b in the embodiment shown.

Optical signal 670a originates from one or more sending devices 622a of the sending circuit 606a in PIC die 602a, propagates through the loopback waveguide 650b in the neighboring die 602b, and is received by the receiving device 624a in receiving circuit 608a of the PIC die 602a. Optical signal 670a is formed in a sending device 622a with the application of an electrical signal at the contact pads 630a that connect to the optoelectronic sending device 622a of sending circuit 606a of PIC die 602a. The optical signal 670a originates in the sending circuit 606a that includes, in the embodiment shown in FIG. 6A(i), one or more sending devices 622a, one or more portions of an interconnection waveguide 644a and optical circuit device 640a, to loopback waveguide 650b.

Loopback waveguide 650b includes the portion of the optical loopback waveguide circuit that resides on the PIC die 602b, and may include a portion of the loopback pathway that resides in the scribe line between the PIC die 602a and the PIC die 602b. In the embodiment shown in FIG. 6A(i), a portion of the optical interconnect waveguide 644a connects the optical device 640a to the loopback waveguide 650b. In this embodiment, the optical signal 670a further propagates through the loopback waveguide 650b and is received in receiving portion 608a. In embodiments, optical signal 670a is the same optical signal 670a having propagated through a loopback waveguide 650b. The loopback waveguide 650b resides on a neighboring die 602b as shown, relative to the die 602a for which the waveguide 650b is used to provide a functionality assessment. That is, the waveguide 650b on die 602b is used in the testing of the die 602a that is shown immediately to the left of 602b in the embodiment shown in FIG. 6A(i). In the receiving circuit 608a of PIC die 602a, the optical signal 670a may propagate through optical circuit elements 642a and portions of optical interconnect waveguide 644a to reach a receiving device 624a, wherein an electrical signal is formed that is detectable at the corresponding contact pads 630a at the electrical interface 612a of PIC die 602a.

In embodiments, optical signal 670a is formed in sending device 622a. Sending device 622a is an optoelectronic device capable of receiving an electrical signal and forming an optical signal. Optical signal 670a, in embodiments, can be encoded with information in sending circuit 606a either by encoding the electrical signal to the sending device 622a or by an encoding device such as an electro-absorption modulator positioned to receive the optical signal from the sending device 622a. In an embodiment, the sending device 622a is a laser. In yet another embodiment, the sending device 722a is a light emitting diode. In other embodiments, the sending device 622a is a combination a laser and an electro-absorption modulator. In other embodiments, the sending device 622a is a combination of one or more lasers or other sending devices and one or more electro-absorption modulators or other forms of signal modulator devices. Any device or combination of optoelectrical devices capable of providing an optical signal can be used as a sending device within the scope of embodiments.

In embodiments, the sending device 622a is connected via electrical interconnects 632a, as shown in the top-down view in FIG. 6A(i) and in the cross-sectional view in FIG. 6A(ii), to electrical interface 612a. Electrical contact pads 630a in electrical interface 612a, receive an electrical signal from contact probes 664 on probe head 662, as shown in FIG. 6B, that are electrically connected to parametric tester 660. Parametric tester 660 is a device known in the art of electrical device characterization in which one or more voltage sources, one or more current sources, or a combination of one or more voltage and current sources are connected to electrical devices and a resulting device parameter such as an output voltage, output current, capacitance, inductance, resistance, or other device characteristic is measured, and in embodiments, recorded, processed, or otherwise analyzed. In embodiments, the parametric tester 660 provides a voltage to one or more electrical contact pads 630 to activate the sending device 622 to form optical signal 670a. Optical signal 670a in these and other embodiments, is formed in optical circuit 606a, traverses a path through the loopback waveguide 650b and is received in receiving device 642a in the receiving circuit 608a.

In embodiments, the assessment of a PIC 602a determines a measure its functionality. In some embodiments in which the PIC falls outside of a range of desired operational values, the PIC 602a is marked with ink or other form of identification or labeling to distinguish the level of functionality in comparison to other PIC die 602. Devices 602 may be determined, for example, to be functional, non-functional, or partly functional depending on the measured parameter or metric for comparison.

Referring to the side view in FIG. 6A(ii) of the neighboring PIC die 602a, 602b, additional details of the PIC circuit elements are shown. FIG. 6A (ii) shows the electrical contacts 630a, 630b with a buried metal interconnect layer 632a, 632b for the two PIC die 602a, 602b, respectively, on the substrate 600. Buried metallization layer 632a, 632b, in some embodiments, is formed using semiconductor fabrication techniques well known in the art that includes lithographic patterning of photosensitive layers to define a mask, and etch processes to pattern the mask layers, the metal layers, and the intermetal dielectric layers. In embodiments, the interconnect layers 632a of the PIC die 602a connect the electrical contact pads 630a to the optoelectrical devices 622a, 624a.

The optical signal 670a from the sending device 622a propagates in some embodiments in waveguide 644a to optical circuit, device, or component 640a. In some embodiments, a plurality of optoelectrical devices 622a are used in the PIC die 602a. Optical component 640a in some embodiments is a waveguide. In other embodiments, optical device 640a is a multiplexer. In some embodiments, the optical device 640a can be any device or combination of optical or optoelectronic device or media that transmits, converts, processes, alters, parses, transfers or otherwise conditions, modifies, transmits, or alters the optical signal 670a. A portion of an optical interconnect 644a is provided in embodiments between the optical device 640a and the loopback waveguide 650b on the neighboring die 602b that receives the optical signal 670a from the optical device 640a and routes the signal 670a to the loopback waveguide 650b to another length of interconnecting waveguide 644a that resides between the edge of the die 602a and the receiving device 642a. Optical device 642a in some embodiments is a waveguide. In other embodiments, optical device 640a is a demultiplexer. In some embodiments, the optical device 642a can be any device or combination of optical or optoelectronic device or media that transmits, converts, processes, alters, parses, transfers or otherwise conditions, modifies, transmits, or alters the optical signal 670a from the loopback waveguide 650b.

The optical signal 670a is transferred, in some embodiments, through one or more waveguides 644a to receiving device 624a. Receiving device 624a, in embodiments, is one or more receiving devices such as a photodiode. In embodiments, receiving device 624a is any optoelectrical device or combination of devices that receives an optical signal and is capable of converting this received optical signal to an electrical signal. The metallization layer 632a connects the optoelectrical device 624a to electrical contact pads 630a in electrical interface 612a.

In the electrical interface 612a shown in the embodiment in FIG. 6A(i), two electrical contact pads 630a are shown interconnected to the sending device 622a and two electrical contact pads 630a are shown interconnected to the receiving device 624a. In other embodiments, the electrical interface 612a can have many additional contact pads that are connected to additional optoelectrical devices or other electrical devices.

Referring to FIG. 6B, a schematic illustration of wafer 600 is shown with an embodiment of an electrical testing configuration comprising an electrical probe head 662 and a parametric tester 660. Electrical contact probes 664 extend from the probe head in the embodiment shown, and provide a means for forming an electrical contact between contact pads 630a located on the wafer 600 and the parametric tester 660. Wafer 600 comprises PIC die 602 such as die 602a, 602b shown in FIG. 6A(i). In embodiments, probe contacts 664 are aligned with the contact pads 630 on wafer 600 and the contact probes 664 of the probe head 662 are brought into electrical contact with the contact pads 630.

Contact probes 664 on probe head 662 are electrically connected to parametric tester 660. The parametric tester is suitably equipped for providing one or more electrical signals to one or more of the contact pads 630 that lead to the optoelectrical device 622. The parametric tester is also suitably equipped, in embodiments, for one or more of detecting and measuring of one or more electrical signals from one or more of the contact pads 630 that lead to the optoelectrical device 624. Parametric tester 660 is a device known in the art of electrical device characterization capable of detecting and measuring one or more electrical device characteristics such as voltage, current, capacitance, inductance, resistance, or other metric or device characteristic is measured, and in some embodiments recorded.

In embodiments, the parametric tester 660 provides a voltage to one or more electrical contact pads 630 to activate the sending device 622 to produce an optical signal such as optical signal 670a. Optical signal 670a in these and other embodiments, is formed in optoelectrical circuit 606a of example PIC die 602a, traverses a path through the loopback waveguide 650b on the neighboring die 702b, and is received in receiving device 642a in the receiving circuit 608a. During operation, in an embodiment, an electrical signal from the receiving device such as device 624a of receiving circuit 608a, is measured at the contact pads 630a in the electrical interface 612a that are connected to the receiving device 624a. Parametric tester 660, connected to the contact pads 630a through the contact probes 664 on the probe head 662, in embodiments, is used to measure the electrical signal imparted on the contact pads 630a as a result of the received optical signal 670a.

Referring to FIG. 6C, a schematic illustration of an array of PIC die 602 of wafer 600 is shown to further illustrate elements of embodiments shown in FIGS. 6A(ii) and 6A(iii). FIG. 6C shows example PIC die 602a-602i that further illustrate the utilization and relative positioning of the loopback waveguide 650 within the array of die. The example array of PIC die shows nine PIC die 602, three die wide by three die high, in which the loopback waveguides 650 receive and send the optical signals 670 from and to a neighbor during a testing operation, respectively, as described herein.

FIG. 6C shows example loopback waveguides 650b, 650e, and 650h of PIC die 602b, 602e, and 602h, respectively, configured to receive optical signal 670a, 670d, 670g from PIC die 602a, 602d, and 602g, respectively, as shown. PIC die 602b contains the loopback waveguide 650b to enable assessment of PIC die 602a, PIC die 602e contains a loopback waveguide 650e to enable assessment of PIC die 602d, and PIC die 602h contains a loopback waveguide 650h to enable assessment of PIC die 602g. Similarly, loopback waveguides 650c, 650f, and 650i contained within PIC die 602c, 602f, and 602i, respectively, are configured to receive optical signal 670b, 670e, 670h from PIC die 602b, 602e, and 602h, respectively, as shown. PIC die 602c contains a loopback waveguide 650c to enable assessment of PIC die 602b, PIC die 602f contains a loopback waveguide 650f to enable assessment of PIC die 602e, and PIC die 602i contains a loopback waveguide 650i to enable assessment of PIC die 602h.

And similarly, loopback waveguides on die to the immediate right of die 602c, 602f, and 602i, as shown, can be utilized in the testing of the optical circuits on die 602c, 602f, and 602i. And similarly yet, the loopback waveguides 650a, 650d, and 650g, as shown, can be utilized in embodiments, for the assessment of the die that may be present to the immediate left of these die. It is important to note that the optical signals 670 propagate in the die within which the signal is formed and the loopback waveguide of the neighboring die. The propagation of the optical signals 670 in the neighboring die, in embodiments, are typically confined to the loopback waveguide, although additional processing of the signal could be performed, in some embodiments, on the neighboring die prior to the returning of the optical signal 670 to the receiving circuit 608 of the die being tested.

The formation of optical signal 670 from optoelectrical sending device 622, and the transmission of this signal through the loopback waveguide structure 650 of the neighboring die, and into the receiving device 624, provides for the electrical and optical evaluation and testing of the devices mounted or otherwise formed in the PIC die 602, the electrical interconnects 632, the optical waveguides 644 that interconnect the optical devices 640, 642 in the PIC die 602, and the integration of all of these optical and electrical interconnections and circuits in the PICs 602 at the wafer level, prior to singulation of the wafer 600.

Referring to FIG. 7, illustrations are shown that highlight specific features of embodiments. In FIG. 7A(i), a top-down schematic view of neighboring PIC die 702a, 702b are shown. PIC die 702a, 702b are optoelectronic integrated circuits. In FIG. 7A(i), embodiments of the elements of each of the neighboring PIC die 702a, 702b are shown with similar circuit elements. PIC die 702a includes a sending circuit 706a, a receiving circuit 708a, and an electrical interface 712a. In embodiments, the electrical interface 712a has electrical contact pads 730a electrically connected to metallization lines 732a buried within, on, or some combination of buried and unburied layers that connect the electrical contact pads 730a to optoelectrical devices 722a, 724a. Optoelectrical device 722a is comprised of one or more sending devices. A sending device such as device 722a can be a laser or a light emitting diode, or other form of optically emitting device that can form an optical signal from the application of an electrical signal to the device. Optoelectrical device 724a is comprised of one or more receiving devices. A receiving device such as device 724a can be a photodetector, for example, or other form of optical receiving device that can receive an optical signal and convert the optical signal to an electrical signal. Additional electrical, optical, optoelectrical, and other types of devices and circuitry may be present on the die PIC 702a in addition to these circuit elements 706a, 708a, and additional contact pads 730a and electrical connections 732a are present in some embodiments. In some embodiments, waveguides 744a interconnect optical and optoelectrical devices on the PIC die 702a. Multiple sending and receiving circuits are present in some embodiments.

Also shown in the figure is an embodiment of loopback waveguide 750a, 750b. Loopback waveguide 750a occupies a portion of the PIC die 702a and loopback waveguide 750b occupies a portion of the PIC die 702b as shown in the top-down schematic illustration of the embodiment in FIG. 7A(i). Loopback waveguide 750b, residing on PIC die 650b, is used in the evaluation of the functionality of the neighboring die 750a as described herein. Similarly, loopback waveguide 750a is used in the evaluation of the functionality of the neighboring die to the immediate left of PIC die 702a (partial die shown). Likewise, the loopback waveguide on the partial die to the right of PIC die 702b shown in FIG. 7A(i) is used to evaluate the functionality of the PIC die 702b in the embodiment shown.

Optical signal 770a originates from one or more sending devices 722a of the sending circuit 706a in PIC die 702a, propagates through the loopback waveguide 750b in the neighboring die 702b, and is received by the receiving device 724a in receiving circuit 708a of the PIC die 702a. Optical signal 770a is formed in sending device 722a with the application of an electrical signal at the contact pads 730a that connect to the optoelectrical sending device 722a of sending circuit 706a of PIC die 702a. The optical signal 770a originates in the sending circuit 706a that includes, in the embodiment shown in FIG. 7A(i), one or more sending devices 722a, one or more portions of an interconnection waveguide 744a and optical circuit device 740a, to loopback waveguide 750b.

Loopback waveguide 750b includes the portion of the optical loopback waveguide circuit that resides on the PIC die 702b, and may include a portion of the loopback pathway that resides in the scribe line between the PIC die 702a and the PIC die 702b. In the embodiment shown in FIG. 7A(i), a portion of the optical interconnect waveguide 744a connects the optical device 740a to the loopback waveguide 750b. In this embodiment, the optical signal 770a further propagates through the loopback waveguide 750b and is received in receiving portion 708a. In embodiments, optical signal 770a is the same optical signal 770a having propagated through a loopback waveguide 750b. The loopback waveguide 750b resides on a neighboring die 702b as shown, relative to the die 702a for which the waveguide 750b is used to provide a functionality assessment. That is, the waveguide 750b on die 702b is used in the testing of the die 702a that is shown immediately to the left of 702b in the embodiment shown in FIG. 7A(i). In the receiving circuit 708a of PIC die 702a, the optical signal 770a may propagate through optical circuit elements 742a and portions of optical interconnect waveguide 744a to reach a receiving device 724a, wherein an electrical signal is formed that is detectable at the corresponding contact pads 730a at the electrical interface 712a of PIC die 702a.

In the embodiment shown in FIG. 7A(i), the loopback waveguide 750b is interlaced, combined, merged, or otherwise integrated with or within other features of the neighboring PIC 702b. In FIG. 7A(i), for example, the loopback waveguide 750b is positioned around three sides of the electrical interface of the PIC 702b, as shown. In this example embodiment, a portion of the loopback waveguide is positioned between the electrical interface 712b and the sending and receiving circuits 706, 708. In other embodiments, the integrated loopback waveguide 750*b* surrounds or is interlaced with electrical interface 712*b* or one or more other features or elements of the PIC die 702*b*. In yet other embodiments, the waveguide 750*b* largely surrounds the features of the PIC die 702*b*. This interlacing or integration of the loopback waveguide 750*b* provides for the efficient utilization of die surface area on the neighboring PIC die 702*b* to accommodate the loopback waveguide 750*b*. Placement of a loopback waveguide on a neighboring die also eliminates the requirement to utilize large areas on the die that are to be tested, or to commit large areas of the wafer between the die to accommodate the loopback waveguide structure. In order to operate with other devices in an optical communications network, the output of the sending circuits 706*a*, for example, and the input of the receiving circuits 708*a*, for example, are typically positioned at the wafer edge to accommodate the placement of optical fibers at the edge of the die 702*a* that align with the waveguide sections 744*a*. The positioning of the loopback waveguides at the edge of the die, such that the loopback waveguides on the neighboring die can be formed in union with the interconnect waveguide portion 744*a*, can result in efficient utilization of surface area because of the practice in the art to attach the optical fibers at the edge of the wafer. In typical applications in which optical fiber connections are made at the wafer edge, test structures positioned at the edge of the die would require removal in order to form the connections between the optical fibers and the interconnect waveguides 744*a* at the edge of the wafer. By integrating the loopback waveguide, however, within the features on the neighboring die, the impact of the loopback waveguide on overall wafer surface area utilization can be reduced. The loopback waveguides can be integrated into features on the neighboring die and remain substantially in place after testing and die singulation.

In embodiments, optical signal 770*a* is formed in sending device 722*a*. Sending device 722*a* is an optoelectronic device capable of receiving an electrical signal and forming an optical signal. Optical signal 770*a*, in embodiments, can be encoded with information in sending circuit 706*a* either by encoding the electrical signal to the sending device 722*a* or by an encoding device such as an electro-absorption modulator positioned to receive the optical signal from the sending device 722*a*. In an embodiment, the sending device 722*a* is a laser. In yet another embodiment, the sending device 722*a* is a light emitting diode. In other embodiments, the sending device 722*a* is a combination of a laser and an electro-absorption modulator. In other embodiments, the sending device 722*a* is a combination of one or more lasers or other sending devices and one or more electro-absorption modulators or other forms of signal modulator devices. Any device or combination of optoelectrical devices capable of providing an optical signal can be used as a sending device within the scope of embodiments.

In embodiments, the sending device 722*a* is connected via electrical interconnects 732*a*, as shown in the top-down view in FIG. 7A(i) and in the cross-sectional view in FIG. 7A(ii), to electrical interface 712*a*. Electrical contact pads 730*a* in electrical interface 712*a*, receive an electrical signal from contact probes 764 on probe head 762, as shown in FIG. 7B, that are electrically connected to parametric tester 760. Parametric tester 760 is a device known in the art of electrical device characterization in which one or more voltage sources, one or more current sources, or a combination of one or more voltage and current sources are connected to electrical devices and a resulting device parameter such as an output voltage, output current, capacitance, inductance, resistance, or other device characteristic is measured, and in embodiments, recorded, processed, or otherwise analyzed. In embodiments, the parametric tester 760 provides a voltage to one or more electrical contact pads 730 to activate the sending device 722 to form optical signal 770*a*. Optical signal 770*a* in these and other embodiments, is formed in optical circuit 706*a*, traverses a path through the loopback waveguide 750*b* and is received in receiving device 742*a* in the receiving circuit 708*a*.

In embodiments, the assessment of a PIC 702*a* determines a measure its functionality. In some embodiments in which the PIC falls outside of a range of desired operational values, the PIC 702*a* is marked with ink or other form of identification or labeling to distinguish the level of functionality in comparison to other PIC die 702. Devices 702 may be determined, for example, to be functional, non-functional, or partly functional depending on the measured parameter or metric for comparison.

Referring to the side view in FIG. 7A(ii) of the neighboring PIC die 702*a*, 702*b*, additional details of the PIC circuit elements are shown. FIG. 7A(ii) shows the electrical contacts 730*a*, 730*b* with a buried metal interconnect layer 732*a*, 732*b*, on the PIC die 702*a*, 702*b*, respectively, on the substrate 700. Buried metallization layer 732*a*, 732*b*, in some embodiments, is formed using semiconductor fabrication techniques well known in the art that includes lithographic patterning of photosensitive layers to define a mask, and etch processes to pattern the mask layers, the metal layers, and intermetal dielectric layers. In embodiments, the interconnect layers 732*a* of the die 702*a* connect the electrical contact pads 730*a* to the optoelectrical devices 722*a*, 724*a*. Corresponding features are provided on other similar die on the wafer 700, as for example, 702*b*, among others.

The optical signal 770*a* from the sending device 722*a* propagates in some embodiments in waveguide 744*a* to optical circuit, device, or component 740*a*. In some embodiments, a plurality of optoelectrical devices 722*a* are used in the PIC die 702*a*. Optical component 740*a* in some embodiments is a waveguide. In other embodiments, optical device 740*a* is a multiplexer. In some embodiments, the optical device 740*a* can be any device or combination of optical or optoelectronic device or media that transmits, converts, processes, alters, parses, transfers or otherwise conditions, modifies, transmits, or alters the optical signal 770*a*. A portion of an optical interconnect 744*a* is provided in embodiments between the optical device 740*a* and the loopback waveguide 750*b* on the neighboring die 702*b* that receives the optical signal 770*a* from the optical device 740*a* and routes the signal 770*a* to the loopback waveguide 750*b* to another length of interconnecting waveguide 744*a* that resides between the edge of the die 702*a* and the receiving device 742*a*. Optical device 742*a* in some embodiments is a waveguide. In other embodiments, optical device 740*a* is a demultiplexer. In some embodiments, the optical device 742*a* can be any device or combination of optical or optoelectronic device or media that transmits, converts, processes, alters, parses, transfers or otherwise conditions, modifies, transmits, or alters the optical signal 770*a* from the loopback waveguide 750*b*.

The optical signal 770*b* is transferred, in some embodiments, through one or more waveguides 744*a* to receiving device 724*a*. Receiving device 724*a*, in embodiments, is one or more receiving devices such as a photodiode. In embodiments, receiving device 724*a* is any optoelectrical device or combination of devices that receives an optical signal and is capable of converting this received optical signal to an electrical signal. The metallization layer 732a connects the optoelectrical device 724a to electrical contact pads 730a in electrical interface 712a.

In the electrical interface 712a shown in the embodiment in FIG. 7A(i), two electrical contact pads 730a are shown interconnected to the sending device 722a and two electrical contact pads 730a are shown interconnected to the receiving device 724a. In other embodiments, the electrical interface 712a can have many additional contact pads that are connected to additional optoelectrical devices or other electrical devices.

The loopback waveguide 750b receives the optical signal 770a from the sending device circuit 706a and this signal 770a propagates through the loopback waveguide 750b to the receiving circuit 708a. The loopback waveguide 750b through which the optical signal propagates on the neighboring die 702b, can be configured to be interlaced or otherwise integrated within the features of the neighboring PIC die 702b, some embodiments of which are provided in FIG. 4.

Referring to FIG. 7B, a schematic illustration of wafer 700 is shown with an embodiment of an electrical testing configuration comprising an electrical probe head 762 and a parametric tester 760. Electrical contact probes 764 extend from the probe head in the embodiment shown, and provide a means for forming an electrical contact between contact pads 730a located on the wafer 700 and the parametric tester 760. Wafer 700 comprises PIC die 702 such as die 702a, 702b shown in FIG. 7A(i). In embodiments, probe contacts 764 are aligned with the contact pads 730 on wafer 700 and the contact probes 764 of the probe head 762 are brought into electrical contact with the contact pads 630.

Contact probes 764 on probe head 762 are electrically connected to parametric tester 760. The parametric tester is suitably equipped for providing one or more electrical signals to one or more of the contact pads 730 that lead to the optoelectrical device 722. The parametric tester is also suitably equipped, in embodiments, for one or more of detecting and measuring of one or more electrical signals from one or more of the contact pads 730 that lead to the optoelectrical device 724. Parametric tester 760 is a device known in the art of electrical device characterization capable of detecting and measuring one or more electrical device characteristics such as voltage, current, capacitance, inductance, resistance, or other metric or device characteristic is measured, and in some embodiments recorded.

In embodiments, the parametric tester 760 provides a voltage to one or more electrical contact pads 730 to activate the sending device 722 to produce optical signal such as optical signal 770a. Optical signal 770a in these and other embodiments, is formed in optoelectrical circuit 706a of example PIC die 702a, traverses a path through the loopback waveguide 750b on the neighboring die 702b, and is received in receiving device 642a in the receiving circuit 708a. During operation, in an embodiment, an electrical signal from the receiving device such as device 724a of receiving circuit 708a, is measured at the contact pads 730a in the electrical interface 712a that are connected to the receiving device 724a. Parametric tester 760, connected to the contact pads 730a through the contact probes 764 on the probe head 762, in embodiments, is used to measure the electrical signal imparted on the contact pads 630a as a result of the received optical signal 670a.

Referring to FIG. 7C, a schematic illustration of an array of PIC die 702 of wafer 700 is shown to further illustrate elements of the embodiment shown in FIGS. 7A(ii) and 7A(iii). FIG. 7C shows example PIC die 702a-702i that further illustrate the utilization and relative positioning of the loopback waveguide 750 within the array of die. The example array of PIC die shows nine PIC die 702, three die wide by three die high, in which the loopback waveguides 750 receive and send the optical signals 770 from and to a neighbor during a testing operation, respectively, as described herein.

FIG. 7C shows example loopback waveguides 750b, 750e, and 750h of PIC die 702b, 702e, 702h, respectively, configured to receive optical signal 770a, 770d, 770g from PIC die 702a, 702d, and 702g, respectively, as shown. PIC die 702b contains the loopback waveguide 750b to enable assessment of PIC die 702a, PIC die 702e contains a loopback waveguide 750e to enable assessment of PIC die 702d, and PIC die 702h contains a loopback waveguide 750h to enable assessment of PIC die 702g. Similarly, loopback waveguides 750c, 750f, and 750i contained within PIC die 702c, 702f, and 702i, respectively, are configured to receive optical signal 770b, 770e, 770h from PIC die 702b, 702e, and 702h, respectively, as shown. PIC die 702c contains a loopback waveguide 750c to enable assessment of PIC die 702b; PIC die 702f contains a loopback waveguide 750f to enable assessment of PIC die 702e; and PIC die 702i contains a loopback waveguide 750i to enable assessment of PIC die 702h.

And similarly, loopback waveguides on die to the immediate right of die 702c, 702f, and 702i, as shown, can be utilized in the testing of the optical circuits on die 702c, 702f, and 702i. And similarly yet, the loopback waveguides 750a, 750d, and 750g, as shown, can be utilized in embodiments, for the assessment of the die that may be present to the immediate left of these die. It is important to note that the optical signals 770 propagate in the die within which the signal is formed and the loopback waveguide of the neighboring die. The propagation of the optical signals 770 in the neighboring die, in embodiments, are typically confined to the loopback waveguide, although additional processing of the signal could be performed, in some embodiments, on the neighboring die prior to the returning of the optical signal 770 to the receiving circuit 708 of the die being tested.

The formation of optical signal 770 from optoelectrical sending device 722, and the transmission of this signal through the loopback waveguide structure 750 of the neighboring die, and into the receiving device 724, provides for the electrical and optical evaluation and testing of the devices mounted or otherwise formed in the PIC die 702, the electrical interconnects 732, the optical waveguides 744 that interconnect the optical devices 740, 742 in the PIC die 702, and the integration of all of these optical and electrical interconnections and circuits in the PICs 702 at the wafer level, prior to singulation of the wafer 700.

Referring to FIG. 8, a series of isometric drawings are provided in FIGS. 8A-8E to further illustrate a sequence of steps in the formation of an embodiment of PIC die 802 on substrate 800 as described in the Process Flow 501 shown in FIG. 5. In FIG. 8, the steps in the formation of a single die is shown but it should be understood that the PIC die 802 shown is just one of a plurality of PIC die 802 formed on the substrate 800. Singulation, or die separation, is performed, for example, at a latter step in the die fabrication sequence as noted in the sequence of steps. In embodiments, substrate 800 is a wafer such as described herein. In FIG. 8A, a substrate 800 is formed. Substrate 800 is further formed with metallization layer that provides patterned conductive traces. The metallization layer is one or more patterned metal layers and intermetal insulating layers that provide electrical connectivity between the electrical and optoelectrical devices that are to be mounted or otherwise formed on the PIC die 802. The techniques used in the formation of patterned metallization layers are well understood by those skilled in the art of semiconductor fabrication.

In FIG. 8B, a first optoelectrical circuitry 806 with at least one sending device 822 and a second optoelectrical circuitry 808 with at least one receiving device 824 is formed with planar waveguides 844, and loopback waveguide 850. Optical circuits, components, or devices 842, 844 are formed in some embodiments. Also formed is electrical interface 812 with electrical contact pads 830 connected to electrical interconnections 832. The contact pads 830 connect the contact pads 830 to the sending and receiving devices 822, 824. Waveguides 844 provide interconnectivity between optical and optoelectrical devices within the PIC die 802. In some embodiments, the waveguides 844, 850 are formed from a dielectric layer. In some embodiments, the waveguides are formed from silicon oxynitride layer. In yet other embodiments, the waveguides 844, 850 are formed from a semiconductor layer. In some embodiments the waveguides 844, 850 are formed of indium phosphide, gallium arsenide, or a compound of indium phosphide or gallium arsenide. In some embodiments, the waveguides 844, 850 are of the same material and in other embodiments, waveguides 844 and waveguide 850 are formed from different materials.

In embodiments, all or a portion of the loopback waveguide 850 resides on a portion of a neighboring die, and in some embodiments, the loopback waveguide may be integrated, interlaced, or otherwise formed within electrical, optical, or mechanical features of the neighboring die as described herein and in particular, as shown in FIG. 7.

In the embodiment shown in FIG. 8, optoelectrical devices that include one or more sending devices 822 and one or more receiving devices 824, and one or more optical devices 840, 842 are formed on the substrate 800. Optoelectrical devices 822, 824 and optical devices 840, 842 are mounted devices in some embodiments. In other embodiments, the optoelectrical devices 822, 824 and optical devices 840, 842 are fabricated in place on the substrate 800. In some embodiments, the optoelectrical devices 822, 824 are connected via electrical interconnects 832 to contact pads 830 in electrical interface 812. In other embodiments, the electrical contact pads 830 are located in a single electrical interface 812 on the PIC die 802. In yet other embodiments, the electrical contact pads 830 are located within two or more electrical interfaces 812 in the PIC die 802. In FIG. 8B, the loopback waveguide 850 is shown linking optoelectrical sending device 822 of the sending circuit 806, through waveguide 844 and optical device 840, and the receiving device 824, through optical device 842 and waveguide 844. The linking of the sending device 822 and the receiving device 824 through the optical waveguides 844 and optical devices 840, 842 provides that capability to test the functionality of these optoelectronic devices 824, 822 and other components and devices in the circuits within which these devices are formed.

Referring to FIG. 8C, wafer level testing 884 of the optical, optoelectrical, and electrical circuits, is performed on the PIC die to test at least one parameter to assess the functionality of the PIC die 802. An electrical probe connected to a parametric tester, as described herein, provides an electrical signal such as a voltage or current to one or more of the electrical contact pads 830 on electrical interface 812, that are connected to a sending device 822, which then activates the sending device 822 to form an optical signal 870. The optical signal is received by, and passes through the loopback waveguide 850, and is then received by the receiving device 824. The optical signal may also pass through optical devices 840 and 842, in some embodiments, if present.

Following the electrical testing illustrated in FIG. 8C, additional processing steps are performed to further the formation of completed PIC die 802 on substrate 800 as shown in FIG. 8D. This additional processing includes, in embodiments, a removal step to remove a portion of the loopback waveguide 850 and in some embodiments, an etch step to form v-grooves 858 to provide an interface for mounting optical fibers to the PIC die 802. Removal of a portion of the loopback waveguide 850 provides waveguide section 844 at the output of the optical sending device through which optical signals, formed in the sending device 822, are delivered to optical fibers (not shown) mounted in the v-grooves 858. In embodiments of PIC die 802, electrical signals are provided to the electrical interface 812, and subsequently to one or more sending devices 822 to form the outgoing optical signal that exits the PIC die 802 through waveguide section 844 to optical fibers mounted in the v-grooves.

Similarly, removal of a portion of the loopback waveguide 850 also provides waveguide section 844 through which optical signals can be received through an optical fiber mounted in the v-groove 858. These optical signals propagate from a mounted optical fiber through the waveguide section 844, and through optical circuit components 842, and are received by a receiving device 824.

It should be noted, that in embodiments, the loopback waveguide 850 can reside on a neighboring die, as described herein in, for example FIGS. 2-4, and elsewhere. Additionally, the loopback waveguide 850, shown in FIG. 8, can be integrated within other circuit elements on the neighboring die.

Referring to FIG. 8E, an illustration of the PIC die 802 after singulation is shown. Singulation of the die 802 is performed in embodiments using a dicing or etch process, for example, to form, for example, individual PIC 802. FIG. 8E shows an embodiment of a completed PIC die 802 with finished v-grooves 858, and waveguide sections 844 having edge facets 852 that interface with optical fibers (not shown in this figure) that mount in the v-grooves 858 adjacent to the edge facets 852.

Figure 9:
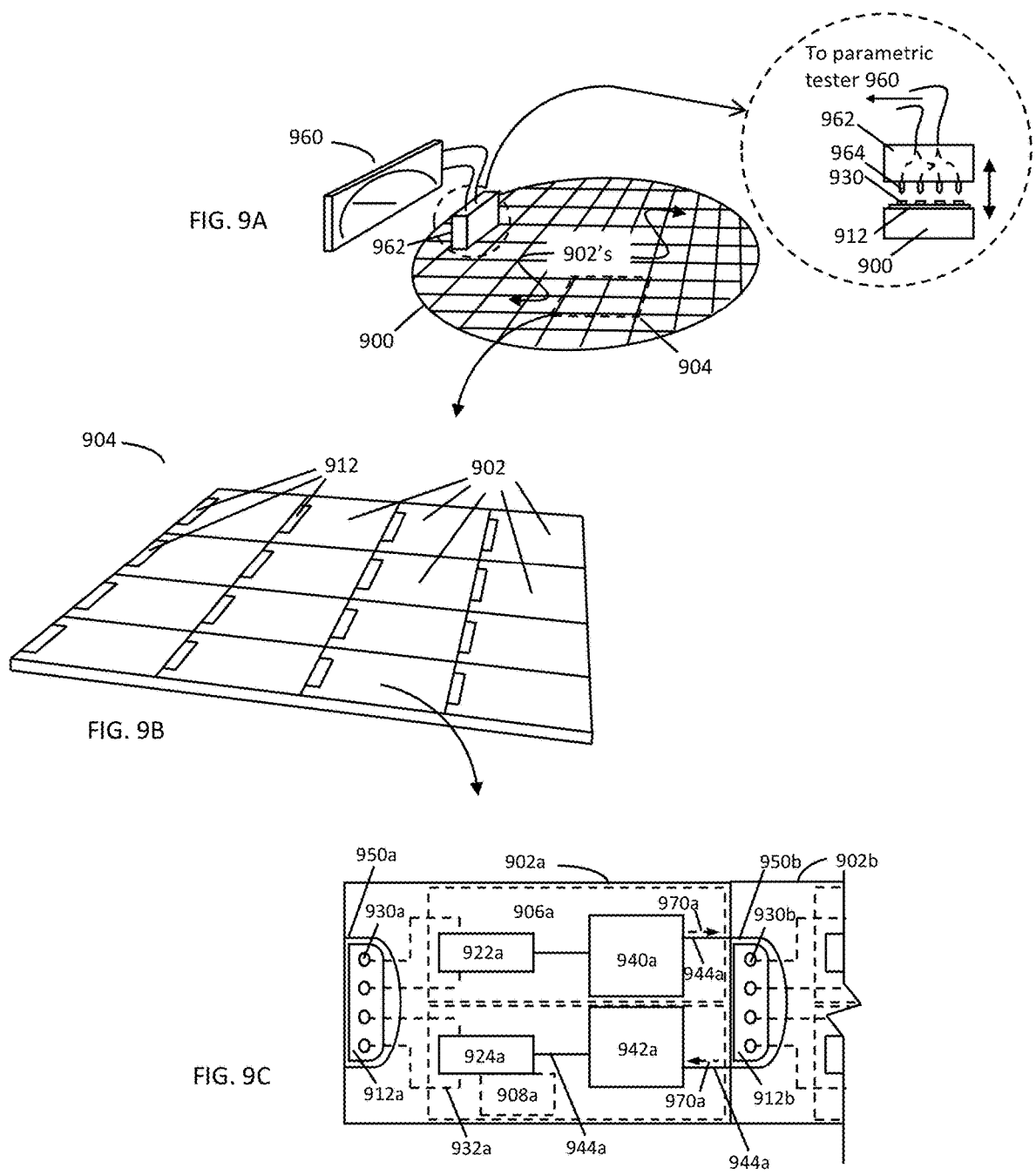

Referring to FIG. 9, an embodiment of an electrical test configuration is shown. In FIG. 9A, wafer 900 is shown in proximity to the probe head 962. Wafer 900 has formed or partially formed PIC die 902. Many PIC die 902 are formed on the wafer 900 using semiconductor fabrication techniques to deposit and pattern the films and layers utilized in the devices of PIC die 902. In some embodiments, one or more of the devices used in the PIC may be formed elsewhere and mounted onto the PIC die 902. In other embodiments, the devices may be fabricated on the substrates using semiconductor fabrication techniques. Lasers and photodiodes, for example, may be fabricated in place, or formed elsewhere and mounted on the die 902. Also shown in FIG. 9A is array 904, a selection of PIC die from wafer 900. In FIG. 9B, an enlarged view of the array 904 from wafer 900 is shown to highlight the electrical interfaces 912 on the PIC die 902. The electrical interface 912 includes the electrical contact pads 930, as shown in FIG. 9C. Electrical contact pads 930*a* are shown on PIC die 902*a* and electrical contact pads 930*b* are shown on the portion of PIC die 902*b* shown. Referring to the PIC die 902*a*, the electrical contact pads 930*a* connect the optoelectrical sending devices 922*a* and optoelectrical receiving devices 924*a* to the probe head contacts 964 shown in the inset of FIG. 9A. Also shown in the inset in FIG. 9A is a probe head 962, example electrical contact pads 930, and the electrical interface 912 from an example die 902 of wafer 900. The probe head contacts 964 are brought into contact with contact pads 930. The arrow shown in the inset of FIG. 9A shows the relative motion of the probe head 964 and the wafer 900 in that the probe head 964, the wafer 900, or both are moved in such a way as to form an electrical connection between the probe contacts 964 and the contact pads 930.

Referring to FIG. 9C, an individual die 902a is shown with a partial neighboring die 902b. Partial neighboring die 902b contains loopback waveguide 950b for testing of the PIC die 902a. In the embodiment shown in FIG. 9C, the loopback waveguide 950b is shown to be integrated within the features of the PIC die 902b, and in the embodiment shown, the loopback waveguide 950b surrounds the electrical interface 912b on the die 902b on three sides. In other embodiments, the loopback waveguide 950 may be integrated in other ways into the PIC die 902 as described, for example, in the embodiments in FIG. 4. Also shown in FIG. 9C are the optical device or circuit 940a in the sending circuit 906a and the optical device or circuit 942a in the receiving circuit 908a. Additionally, optical signal 970a from optoelectrical sending circuitry 906a is shown. Upon the application of an electrical signal to the electrical interface 912a, an optical signal 970a is formed in the sending circuit 906a. The optical signal 970a exits waveguide portion 944a on PIC die 902a to the loopback waveguide 950b on neighboring die 902b, propagates through the loopback waveguide 950b and re-enters another waveguide portion 944a to the receiving circuit 908a. Upon incidence on one or more of the receiving devices 924a in the receiving circuit 908a, an electrical signal is formed on the electrical interface 912a.

Referring to FIG. 10A, a schematic isometric drawing of an embodiment of a portion of PIC die 1002 with v-groove 1058 is shown. The v-groove 1058 is formed at the edge of the substrate 1000, and provides for alignment of the core 1065 of the fiber optic cable 1066 with waveguide section 1044. Waveguide section 1044 is a portion of waveguide, for example, that provides an optical interconnect from the v-groove 1058 to the optical circuits (e.g., 840, 842) of the optoelectronic sending and receiving circuits (e.g., 806, 808) after formation of the v-groove (e.g., 858). This figure illustrates the alignment and positioning of fiber optic cable 1056 within an embodiment of a v-groove 1058, and more particularly, the alignment of the core 1065 of the fiber optic cable 1066 with the waveguide section 1044 of the PIC die 1002. Fiber optic core 1065 is aligned, in embodiments, with the facet 1052 of the waveguide section 1044.

Referring to FIG. 10B, a cross sectional schematic of the embodiment of a portion of PIC die 1002 with v-groove 1058 is shown to further illustrate the alignment of the core 1065 of the fiber optic cable 1066 with the planar waveguide section 1044. The v-groove 1058 formed at the edge of the substrate 1000 provides for alignment of the core 1065 of the fiber optic cable 1066 with the facet 1052 of the waveguide section 1044. In the embodiment shown, the waveguide section 1044 is a portion of an interconnecting waveguide that provides an optical interconnect from the v-groove 1058 to the optical devices or circuits (e.g., 840, 842) of the optoelectronic sending and receiving circuits (e.g., 806, 808), for example, after formation of the v-groove (e.g., 858).

In some embodiments, the loopback waveguide and the connected optical device in the optical circuit (e.g., 840) can be formed by patterning a stack of SiON layers having a thickness comparable with the fiber optic cable 1066, such as having a thickness similar to the diameter of the core 1065, which is in the order of about 10 microns. Thus, the fiber optic cable can be coupled directly to the waveguide portion 1044, e.g., without a need for a spot size converter.

Referring to FIGS. 11 and 12, a process flow diagram and a sequence of drawings, respectively, are shown that illustrate the steps in an example process flow for the formation of an embodiment of an interposer structure within which the loopback waveguide structure can be formed. The example process steps shown in FIG. 11, further describe the brief description of the interposer formation step shown in FIG. 8B. In FIG. 8, a process flow is shown for the formation of the loopback waveguide 850 and in FIG. 8B, a process step is shown that includes the formation of an embodiment of a loopback waveguide with a first optoelectrical circuitry that includes a sending device 822 and a second optoelectrical circuitry that includes a receiving device 824. In FIG. 11, additional details for an embodiment of the formation of the interposer structure are shown. In FIG. 11, the loopback waveguide is not shown in the embodiment but the individual steps for the formation of the interposer are provided. The use of the interposer structure and the individual layers and features, and the processing steps for the formation of an interposer are applicable to the formation of an interposer with the loopback waveguide such as that shown in FIG. 8. In the embodiments described in FIGS. 11 and 12, a fiber optic mounting block is shown for the mounting of the optical fiber at the edge of the interposer substrate is shown. In other embodiments, as for example, in FIG. 8, v-grooves are utilized for the mounting of the optical fibers to the edge of the substrate. Either of these approaches can be utilized in embodiments.

Referring to FIG. 11, a process flowchart is shown for the formation of interposer-based PICs with embodiments of the interposer alignment structures, and aspects of embodiments described in this flowchart are illustrated in FIG. 12. In step 1180 of process flow 1110, a planar waveguide layer 1205 is formed on a base structure, wherein the base structure 1201 includes an optional electrical interconnect layer 1203 on a substrate 1200. The planar waveguide layer 1205 on base structure 1201 forms interposer 1209. The electrical interconnect layer 1203, as shown in FIG. 12A is formed in some embodiments on a semiconductor substrate 1200 such as silicon, indium phosphide, gallium arsenide, or some other semiconductor. In other embodiments, a ceramic or insulating substrate is used. In yet other embodiments, a metal substrate is used. And in yet other embodiments, a combination of one or more semiconductor layers, insulating layers, and metal layers are used to form a substrate 1200 upon which the optional electrical interconnect layer 1203 and the planar waveguide layer 1205 are formed. In some embodiments, the electrical interconnect layer 1203 is not in direct contact with the substrate but rather an intervening layer is present. Similarly, the planar waveguide layer 1205, in some embodiments, is not in direct contact with the underlying electrical interconnect layer 1203 but rather an intervening layer or layers may be present. In some embodiments, a semiconductor layer or substrate is mounted on a metal layer or substrate to form a composite substrate.

In hard mask layer formation step 1182a of the process flow 1110, a hard mask 1216 is formed on the planar waveguide layer 1205. Hard mask layer 1216 includes patterning for the formation of the optical waveguides and all or a portion of the alignment aids that are formed from the planar waveguide layer 1205. In the embodiments in FIG. 12B, the hard mask layer includes patterns for alignment aids that include fiducial marks and the vertical alignment pillars (z-pillars). In the embodiments shown in FIGS. 12B, hard mask layer portion 1216a shows a hard mask pattern for an embodiment of a z-pillar alignment aid which is shown after the hard mask patterning step in FIG. 12B; Similarly, hard mask portion 1216b shows a hard mask pattern for an embodiment of a planar waveguide 1244 which is shown after patterning in FIG. 12(ii). Hard mask portion 1216c shows a hard mask pattern for an embodiment of a fiducial mark alignment aid which is shown after hard mask patterning in FIG. 12B. And hard mask portion 1216d shows a hard mask pattern for an embodiment of an optical device which is shown after hard mask patterning (note: the optical device is represented schematically by the rectangular box due to the potential complexity of optical devices.) In summary, in the embodiment shown in FIG. 12B, portions of the patterned hard mask can include the z-pillar portion 1216a, planar waveguide portion 1216b, fiducial mark portion 1216c, and optical device 1216d. In the embodiment shown in FIG. 12, the portions of the hard mask 1216 are used to pattern the z-pillars 1234, the planar waveguides 1244, the fiducial marks 1214, and the optical devices, respectively, using an etch process to remove the planar waveguide layer 1205 from areas not protected by the hard mask layer 1216 as shown in FIG. 12C. In the embodiment shown in FIG. 12 and in other embodiments, additional patterned hard mask features can be included.

Portions of the hard mask layer 1216, can be used in some embodiments to form all or a portion of optical devices 1240 for embodiments in which the optical devices 1240 are formed wholly or in part from the planar waveguide layer 1205. Optical devices 1240 may be waveguides, gratings, lens, or any device that can be formed from at least a portion of the planar waveguide layer. Alternatively, in other embodiments, optical devices 1240 are mounted devices, and not fabricated directly from the planar waveguide layer 1205 but added at a later step in the process of forming the PIC 1202. Optical devices 1240 can be one or more of a portion of a device or multiple devices formed from the planar waveguide layer and one or more of a portion of a mounted device or multiple mounted devices.

In some embodiments, the planar waveguide layer 1205 is formed of one or more layers of silicon dioxide, silicon nitride, and silicon oxynitride as described herein. To pattern the planar waveguides from such layers using a dry etch process, fluorinated etch chemistries in which one or more commonly utilized gases such as $CF_4$, $CHF_3$, $C_2F_8$, $SF_6$, among others, are used. In embodiments, aluminum or an alloy of aluminum is used to form the hard mask. Aluminum hard masks are known to exhibit a high resistance to dry etching in fluorinated chemistries and thus the dimensions of the hard mask can be maintained during the etching of the planar waveguide layer 1205, in which the fiducial marks 1214, the reference pillars, 1234, the planar waveguides 1244 are formed in Step 1182b of process flow 1110. In other embodiments, other hard masks are used that also exhibit high resistance to the etch chemistry such as Au, Ag, Ni, and Pt. In other embodiments, hard masks layers such as Ti, $TiO_x$, Ta, $TaO_x$, aluminum oxide, silicon nitride, silicon carbide, or a combination of one or more of these materials are used. In some embodiments, oxygen or other oxygen-containing gas is added to the etching chemistry to increase the resistance of the hard mask to the etch chemistry. In yet other embodiments, diluents are added to the fluorinated gas chemistry such as one or more of argon, helium, nitrogen, and oxygen, among others to increase the resistance of the hard mask to the fluorinated etch chemistry. In embodiments, the masking layer typically has a slow rate of removal in comparison to the rate of removal of the planar waveguide layer. Methods for etching of silicon dioxide, silicon nitride, and silicon oxynitride are understood by those skilled in the art of semiconductor processing, as are methods of increasing the resistance of aluminum hard mask layers and other hard mask layers using fluorinated etch chemistries.

After the patterning 1182b of the fiducial marks 1214, the reference pillars 1234, the planar waveguides 1244, and the optical devices if present, the substrate is patterned to facilitate removal of the hard mask material over the waveguides 1244. In step 1182c, a patterned mask material is formed over portions of the PIC that includes the hard mask patterned alignment features 1216a, fiducials 1216c, and optical devices 1216d. The patterned mask layer allows exposure of the patterned waveguides to enable removal of the hard mask from the waveguides for embodiments in which a metal hard mask layer is utilized. The patterned mask layer, in some embodiments, is a photoresist layer. In other embodiments, this mask layer is a hard mask layer. In embodiments, the mask layer is patterned to expose the underlying patterned hard mask layer portion 1216b over the patterned waveguides 1244 and to protect the patterned hard mask layer portion 1216c over the fiducial marks 1214, the patterned hard mask layer portion 1216a over the reference pillars 1234, and optionally the patterned hard mask layer 1216d over the optical devices, if present, and if warranted. In some embodiments, the optical devices may also require removal of the hard mask for optimal operation. Exposure of the hard mask layer portion 1216b over the waveguides enables removal 1182c in process flow 1110 of the hard mask portion 1216b from the patterned waveguides 1244 without the removal of the hard mask portions 1216a, 1216c, and 1216d from the fiducial marks 1214 and the z-pillars 1234.

A schematic illustration of features of the PIC after removal of the hard mask portion 1216b and subsequent removal of the mask layer that is used in embodiments to protect the hard mask portions 1216a, 1216c, and optionally 1216d, is shown in FIG. 12D. Removal of the hard mask portion 1216b (see FIG. 12C from the planar waveguides 1244 of the hard mask layer 1216 is achieved in some embodiments using a wet etch process that selectively removes the metal or other hard mask with little or no removal of the underlaying planar waveguide layer. Metal etchants, such as those used for the removal of an aluminum hard mask, for example, and that have little or no effect on waveguide fabricated from silicon nitride and silicon dioxide, for example, are known in the art of semiconductor processing. In other embodiments, a dry etch process is used. A benefit of a wet etch process to remove the hard mask portion 1216b from the planar waveguide 1244 below includes a high preferential selectivity for etching of the hard mask 1216b with minimal removal of the underlying planar waveguides 1244.

Upon completion of the removal step 1182c of the hard mask portion 1216b from the planar waveguides 1244, and removal of the photoresist mask layer that was used to protect the hard mask portions 1216a, 1216c, and optionally 1216d, a forming step 1182d is shown in the process flow 1110 to form a thick insulating dielectric layer 1238 as illustrated in FIG. 12E. The thick dielectric layer 1238 may be one or more layers of silicon dioxide, silicon nitride, or silicon oxynitride, for example, and may include one or more of a planar waveguide cladding layer, a buffer layer, a spacer layer, and a passivation layer, among others. In some embodiments, layer 1238 includes a planarization layer, and a planarization step is used to planarize the thick dielectric layer 1238 after this layer is formed.

Step 1182e of the embodiment of the process flow 1110 is a forming step that includes the formation of cavities 1248, 1249, 1269 in the thick dielectric layer 1238. This cavity forming step 1182e includes a patterned hard mask forming step as illustrated in FIG. 12F and an etching step as illustrated in FIG. 12G, among others. The hard mask 1217 shown in FIG. 12F, is preferably one such as aluminum or from an alloy of aluminum, among others, formed over the insulating layer 1238 and patterned using a plasma etch process or a wet chemical etch process to expose the portions of the underlying insulating layer 1238 within which cavities 1248,1249 are formed, and to expose the portions of the underlying insulating layer 1238 within which cavity 1269 is formed. Aluminum and alloys of aluminum, provide a high resistance to fluorinated etchants used to etch insulating layers such as silicon dioxide, silicon nitride, and silicon oxynitride preferably used in layer 1238. An embodiment of the effect of the etching step on the formation of the cavities 1248,1249,1269 is illustrated in FIG. 12G. The z-pillars 1234 are shown that result from the exposure of the buried hard mask portion 1216a that was formed from the hard mask 1216 in cavity 1248. Exposed fiducials 1214 are also shown that result from the exposure of the buried hard mask portion 1216c that was formed from the hard mask 1216 in cavity 1249. Cavity 1269 is shown having been formed at the edge of the PIC 1202. In practice, the cavity 1269 is formed prior to singulation of the substrate into individual die, and thus the cavity is not cleaved as shown.

In some embodiments, it is or may not be preferable or necessary to expose the buried fiducial marks 1214 to obtain the improved clarity of the fiducials in subsequent steps in which the fiducials 1214 are used in the fabrication of the PIC 1202, or for the placement of optical die onto the PIC 1202. In these embodiments, the patterning step for the hard mask 1217 that is used to expose the areas of the insulating layer 1238 to form the cavities 1248 will not include an allowance for exposure of the areas of the insulating layer 1238 to also form cavities 1249 to expose the fiducials 1214 within these cavities 1249 as illustrated in FIG. 12G. Improved visibility of the fiducials 1214 is to be expected upon the formation of the cavity 1249, but may not be required in some embodiments. Improved visibility of the fiducials may not be required, for example, in embodiments with thin insulating layers 1238, in applications in which the surface of the thick insulating layer 1238 remains visibly transparent, and in embodiments in which the contrast between the fiducials and the underlying layers is adequate. Exposure of the fiducials 1214 with the formation of cavity 1249, in general, provides improved visibility in embodiments for which the cavities 1249 are provided since the focal plane of the fiducial 1214 is shared with the focal plane of the z-pillars 1234 and other alignment aids formed using the hard mask 1216 in these embodiments. The improved visibility also results from the elimination of deleterious effects that processing steps such as mechanical planarization may have on increasing the opacity of the layer 1238 that might limit the visibility of a buried fiducial. In the embodiment illustrated in FIG. 12G, the alignment pillars 1234 are shown in cavity 1248 and the fiducials 1214 are shown in cavity 1249. In other embodiments, the fiducials 1214 are formed in the same cavity 1248 as the alignment reference pillars 1234. In other embodiments, two or more fiducial marks 1214 are formed. In embodiments with two or more fiducial marks 1214, one or more fiducial marks 1214 may be formed within the cavity 1248 and one or more fiducial marks 1214 may be formed in a separate cavity 1249. In yet other embodiments with two or more fiducial marks 1214, multiple cavities 1249 are formed with fiducial marks 1214. The fiducial marks 1214 illustrated herein are shown in the shape of a "+" sign. Other shapes are also used in embodiments. Effective shapes for fiducial marks are understood by those skilled in the art. The formation of the patterned fiducials from the same waveguide layer 1205 as the patterned waveguides 1244 provides a level of resolution consistent with the lithographic patterning resolution, and this high degree of resolution provides a high degree of precision for the placement and alignment of optoelectrical devices into the cavity 1248.

In the schematic drawing in FIG. 12H, the PIC 1202 is shown in embodiments after removal of the hard mask 1217 used in the formation of the cavities 1248,1249,1269 in the insulating layer 1238.

Fiber optic cables for the delivery and extraction of optical signals from the PICs are typically positioned in v-grooves or are attached using optical fiber mounting blocks at the edges of the PIC substrates. In optional forming step 1186, one or more v-grooves 1258 are formed in the PIC 1202 to accommodate the attachment of one or more fiber optic cables 1266. It should be noted that the v-grooves 1258 are typically formed prior to the completion of the PIC fabrication process, and that the fiber optic cables 1266 are typically not mounted to the PIC 1202 until after the completion of the PIC fabrication process and including the completion of the singulation of the substrate into individual PIC die 1202. The positioning of the fiber optic cable 1266 into the v-groove 1258, however, is shown in FIG. 12I to further illustrate the alignment of the core 1265 of the fiber optic cable 1266 with the core of the planar waveguide 1244.

In the embodiments shown in FIG. 12, the alignment and attachment of fiber optic cables 1266 in embodiments is further facilitated with the use of fiber optic cable mounting blocks 1262. Fiber optic cable mounting blocks 1262 enable accurate alignment of the core 1265 of the optical fiber cables 1266 with a facet 1252 of a planar waveguide 1244 on the PIC 1202. FIG. 12I shows an embodiment of a PIC 1202 with a fiber optic cable 1266 positioned in a v-groove 1258 without a fiber optic mounting block 1262 and FIG. 12J shows the embodiment of PIC 1202 with the fiber optic cable 1266 positioned in a fiber optic cable mounting block 1262 with the mounting block 1262 positioned at the edge of an example PIC 1202. The fiber optic cable mounting block 1262 facilitates the alignment and attachment of the fiber optic cable 1266 to the interposer, and in embodiments is held in place in some embodiments with an adhesive or an epoxy.

It should also be noted that although fiber optic cables 1266 are used to facilitate the transfer of optical signals to and from PICs, the use of the techniques described herein is not limited by the presence or lack of a fiber attachment method in embodiments, such as a v-groove or a method for attachment of a fiber optic cable mounting block. The fiber optic mounting schemes can be used, for example, in embodiments of the interposer structure with loopback waveguide as described, for example, in FIG. 8.

Advantages to the alignment of the core of the fiber optic cable 1266 with the facet 1252 of the planar waveguides 1244 formed in the planar waveguide layer 1205 are enabled with embodiments described herein. In the embodiment shown in FIG. 12I, a patterned PR mask is used, for example, to expose the portion of the substrate for the formation of one or more v-grooves. In embodiments in which a photoresist mask is used to expose the locations for the v-grooves, this patterned photoresist mask protects a least a portion of the PIC during the formation of the v-grooves 1258. The etch process for forming v-grooves is well understood in the art of semiconductor fabrication and is typically formed using a wet etch process.

Referring to FIG. 12J, an embodiment of the PIC 1202 is shown after formation of the v-groove 1258 and with a fiber optic mounting block 1262 in place at the edge of the PIC substrate (after cleaving). Surfaces within the v-groove 1258 form a contact with the mounted fiber optic cable 1266. FIG. 12J shows the PIC 1202 with a portion of a fiber optic cable 1266 positioned in the v-groove 1258 and in the fiber optic cable mounting block 1262 to illustrate the use of these alignment features to align the core 1265 of the fiber optic cable 1266 with the end facet 1252 (shown in FIG. 12G of the portion of the planar waveguide 1244 to which the core 1265 is aligned. Alignment of the fiber core 1265 with the waveguide facet 1252 of the planar waveguide 1244 is beneficial for efficient transfer of optical signals between these devices.

Alignment aids 1234 in cavities 1248 provide mounting and alignment aid for optoelectronic die 1222 and optoelectronic die 1224, for example, that can be mounted on the interposer structure. Optoelectronic devices 1222, 1224 are shown in place in the cavities 1248 in FIGS. 12I and 12J. Optoelectronic die 1222, for example, is a sending device such as a laser. Optoelectronic die 1224, for example, is a receiving device such as a photodiode.

The sequence of drawings in FIGS. 12A-12H illustrate the formation of elements of a self-aligned optoelectrical device structure in an interposer-based PIC 1202 and include the z-pillars 1234 in cavities 1248, the buried planar waveguide structures 1244 that terminate at the walls of the cavity 1248, and the fiducial marks 1214. Optical devices 1240 are also shown. The sequence of drawings in FIGS. 12A-12J also illustrate the formation of an embodiment of a v-groove and a cavity for the mounting of a fiber optic cable mounting block 1262 used to facilitate the mounting of fiber optic cable 1266 and the alignment of the core 1265 of the fiber optic cable 1266 with the end facet 1252 of a portion of a planar waveguide 1244. Upon formation of the elements of the PIC structure 1202 as shown in FIGS. 12A-12J, and with the additional steps shown in FIG. 8, embodiments for the loopback waveguide can be formed.

An embodiment of an example waveguide structure is shown in FIG. 13A. The example waveguide structure shown in FIG. 13A is a stack of dielectric films deposited on a substrate 1300. In an embodiment, the substrate is silicon. In other embodiments, the substrate is GaAs, InP, SiGe, SiC, or another semiconductor. In yet other embodiments, the substrate is aluminum nitride, aluminum oxide, silicon dioxide, quartz, glass, sapphire, or another ceramic or dielectric material. In yet other embodiments, the substrate is a metal. And in yet other embodiments, the substrate is a layered structure of one or more of a semiconductor, a ceramic, and a metal. It is to be understood that the substrate can be any material that provides a suitable mechanical support. It is to be further understood that a substrate with an interconnect layer that contains electrical lines and traces, separated with intermetal dielectric material, is a substrate. In a preferred embodiment, the substrate is a silicon substrate with an electrical interconnect layer.

An optical dielectric interposer as shown in FIG. 13A, in an embodiment, includes planar waveguides 1344 formed from a planar waveguide layer. In an embodiment, the planar waveguide structure includes a buffer layer 1333, spacer or cladding layer 1337, a repeating stack of silicon oxynitride films 1335, a top spacer or cladding layer 1339, and an optional top layer 1338.

In embodiments, buffer layer 1333 is one or more layers of silicon dioxide or silicon oxynitride. In some embodiments, the buffer layer is a layer of silicon oxynitride. In a preferred embodiment, the buffer layer 1333 is a silicon oxynitride layer, 5000 nm in thickness, with an index of refraction of 1.55. In other embodiments, the buffer layer 1333 is silicon oxynitride with refractive index of 1.55 and is thicker than 2000 nm. In other embodiments, the buffer layer 1333 is a silicon dioxide layer with a refractive index of approximately 1.445. In other embodiments, the buffer layer 1333 is a silicon dioxide layer with a refractive index of approximately 1.445 that is greater than 2000 nm in thickness. In an embodiment, the buffer layer 1333 is a silicon dioxide layer that is approximately 4000 nm in thickness and with a refractive index of approximately 1.445.

Buffer layer 1333 can be a composite layer of one or more layers of silicon dioxide or silicon oxynitride with varying thicknesses that in some embodiments sum to greater than 4000 nm in total thickness. Similarly, the buffer layer 1333, in some preferred embodiments, can be a composite layer of one or more layers with varying refractive index, that when combined, provide a total thickness of greater than 4000 nm and a composite refractive index in the range of 1.4 to 2.02.

In embodiments, spacer layer 1337 is one or more layers of silicon dioxide or silicon oxynitride. In embodiments, the spacer layer 1337 is a cladding layer for waveguide core layer 1335. In some embodiments, the layer 1337 is a single layer 1337a of silicon oxynitride, 500 nm in thickness, with an index of refraction of 1.55. In some embodiments, layer 1337a is a layer of a single material, such as silicon dioxide. In other embodiments, layer 1337a is a layer of silicon oxynitride. In yet other preferred embodiments, the layer 1337a is a layer of silicon oxynitride with refractive index of 1.55 with thickness of 500 nm. In yet other embodiments, layer 1337a is a layer of silicon oxynitride with thickness in the range of 0 to 1000 nm. Although in some embodiments, layer 1337 is included in the structure, in some other embodiments, the layer 1337, can be formed in combination with the buffer layer.

Layer 1337 can be a composite layer 1337b of one or more layers of silicon oxynitride or silicon dioxide. In an embodiment, composite layer 1337b includes two layers of silicon oxynitride with thicknesses of 250 nm and with a composite refractive index of approximately 1.55. In some embodiments, the sum of the thicknesses of the two layers in composite layer 1337b is in the range of 1 to 1000 nm. In some embodiments, the refractive index can be graded, that is, changing with distance from the core layer 1335.

Similarly, the layer 1337 can be a composite layer 1337c of three or more layers with the same or varying thicknesses and refractive indices, that when combined, provide a total thickness in the range of 1 nm to 1000 nm and a composite refractive index in the range of 1.4 to 2.02.

The combined thicknesses of the buffer layer 1333 and the spacer layer 1337 in embodiments provide spatial separation between the core repeating stack 1335 and the substrate 1310 and reduce, minimize, or eliminate the interaction of the transmitted optical signal with the substrate 1300. The transmission of optical signals with low optical loss through the repeating structure 1335 requires some degree of confinement of the signal to the waveguide core 1335 with minimal interaction of the optical signals with the substrate 1300 in embodiments for which the optical signals are susceptible to attenuation in the substrate material. Silicon and some other semiconductors, and metal layers in the interconnect layers, for example, can lead to significant attenuation of optical signals. The combined thicknesses of the buffer layer 1333 and the layer 1337 provide spatial isolation between the substrate materials and the upper layers of the dielectric stack structure to reduce the interaction of transmitted optical signals with materials in the substrate that can lead to attenuation.

Dielectric stack 1335 forms the core of the waveguide structure through which optical signals can be transmitted with low optical loss. In some embodiments, the dielectric film stack 1335 is a layered structure of silicon oxynitride films. In other embodiments, the dielectric film stack 1335 is a single layer of dielectric material such as silicon oxynitride with a refractive index of 1.6.

In embodiments, the dielectric stack 1335 has a repeating stack 1335a of two dielectric films in which the constituent films within the repeating stack structure 1335a that are of differing refractive indices. Differences in the refractive indices can occur primarily from changes in the stoichiometric composition of the films. In preferred embodiments, the changes in the stoichiometry of the films in the repeating film structure 1335 is accomplished with changes in the process conditions used in the deposition of the films in the repeating film structure 1335. In an embodiment, the repeating stack structure 1335a includes a first film 1335a1 of 900 nm of silicon oxynitride with an index of refraction of 1.6 and a second film 1335a2 of 50 nm of silicon oxynitride with an index of refraction of 1.7. In another embodiment, the repeating structure 1335a includes a first film 1335a1 of 40 nm of silicon oxynitride with an index of refraction of 1.7 and a second film 1335a2 of 500 nm of silicon oxynitride with an index of refraction of 1.65. In yet another embodiment, the repeating structure 1335a includes a first film 1335a1 of 60 nm of silicon oxynitride with an index of refraction of 1.7 and a second film 1335a2 of 500 nm of silicon oxynitride with an index of refraction of 1.65. It is to be understood that the order of the first film 1335a1 and the second film 1335a2 in embodiments can be reversed and remain within the scope and spirit of the embodiments.

In another embodiment, a dielectric stack 1335b has a repeating stack 1335 of more than two dielectric films in which the constituent films 1335b1-1335b3 within the repeating structure 1335a are of differing refractive indices, and in some embodiments, of the same or differing thicknesses. In an embodiment, repeating stack 1335b includes a first film 1335b1 of 400 nm of silicon oxynitride with an index of refraction of 1.6, a second film 1335b2 of 500 nm of silicon oxynitride with an index of refraction of 1.65, and a third film 1335b3 of 50 nm of silicon oxynitride with an index of refraction of 1.7. Other variations in the dielectric structure 1335b as described herein for layers 1335a1, 1335a2 and 1335c1, 1335c2, 1335c3 are applicable to the films 1335b1, 1335b2.

In yet other embodiments, a repeating stack 1335c of the dielectric films stack 1335 includes more than three layers for which the index of refraction for the constituent layers of silicon oxynitride is varied to achieve the total film thickness of the overall dielectric stack structure 1335. In embodiments, for example, in which the repeating film structure 1335c has two constituent films 1335c1, 1335c2 with a combined thickness of 600 nm, the stack must be repeated 15 times to reach an overall thickness of 9 microns for the dielectric film stack 1335. In other embodiments in which the overall thickness of the dielectric film stack is 9 microns, a repeating stack of 45 constituent layers 1335c1-1335c45 of 100 nm each can be implemented in which the overall repeating structure need only be repeated twice to achieve the required thickness. In yet other embodiments, the repeating structure 1335c of dielectric stack 1335 has a layered film structure that does not repeat because the total number of constituent films in the repeating stack provides sufficient overall film thickness for the dielectric film structure 1335.

In some embodiments, the repeating film structure 1335 is a composite structure of repeating stacks. In embodiments with the repeating stack 1335c, the overall thickness of repeating film structure 1335 is the combined thickness of the repeating stack 1335c1, 1335c2 multiplied by the number of times that the repeating stack is repeated. For example, the repeating film structure 1335a for an embodiment in which the first layer 1335a1 is 900 nm and the second layer 1335a2 is 50 nm has a total repeating stack thickness of 950 nm and when repeated 9 times, the resulting combined film thickness for dielectric stack 1335 is 8590 nm ((900 nm+50 nm)×9=8590 nm)). Similarly, in another embodiment, the repeating film structure 1335a, which has a first layer 1335a1 that is 40 nm with a refractive index of 1.7, and which has a second layer 1335a2 that is 500 nm in thickness with a refractive index of 1.65, has a combined thickness for repeating stack 1335 of 540 nm, and when repeated 10 times, has a resulting combined film thickness for dielectric stack 1335 of 5400 nm ((500 nm+40 nm)×10=5400 nm)).

Generally, the overall dielectric stack 1335 is made sufficiently thick to provide the low optical loss for optical signals transmitted through the resulting waveguide structure 1344. The multilayer structure, typically deposited at low processing temperatures of less than 400 degrees Celsius, for example, can facilitate the formation of resulting film structure with low stress levels while enabling thick waveguides (2000 nm to 25000 nm) to be formed. Waveguide structures 1344 are thus sufficiently thick to enable transmission of the optical signals with little interaction of the transmitted optical signals with the substrate, interaction levels that could lead to undesired attenuation of the optical signals propagating in the waveguides.

It is to be understood that the thickness, the number of films, and the refractive index for the films in dielectric stack 1344 can vary and remain within the scope of embodiments. The refractive index of silicon oxynitride films can vary in the range of 1.4 to 2.02. As the concentration of nitrogen in deposited silicon oxynitride films is minimized, the refractive index approaches the index of refraction of silicon dioxide, 1.445. Conversely, as the concentration of oxygen is minimized in the deposited films, the refractive index approaches the index of refraction of silicon nitride, 2.02. The index of refraction can thusly be varied in the range of 1.445 to 2.02 by varying the stoichiometric concentration of silicon, oxygen, and nitrogen in the deposited films. In embodiments, the index of refraction for the constituent films 1335a1, 1335a2 in the repeating dielectric film stack 1335a, for example, are varied in the range of 1.445 to 2.02 to produce thick film structures of 2000 to 25000 nm, or greater, and that provide low stress and low optical signal losses, in dielectric film stacks 1344. In other embodiments, a single layer for the dielectric film 1335 is used in combination with layers 1337, 1339. In embodiments, the index of refraction of the core layer 1335 is lower than that of the layers 1337, 1339 to facilitate containment of optical signals within the core layer 1335.

In yet another embodiment, the dielectric film stack 1335 includes a repeating stack 1335a with a first layer 1335a1 of silicon oxynitride with thickness of 60 nm and an index of refraction of 1.7 and a second layer 1335a2 of silicon oxynitride with thickness of 500 nm and an index of refraction of 1.65. Repeating dielectric stack structure 1335a is repeated in an embodiment 13 times for a total thickness for dielectric film stack 1335 of 7280 nm. It is to be understood that the total number of repeating film stacks 1335a can vary. In some embodiments, the number of repeating film stacks 1335a is three to twenty. In some other preferred embodiments, the repeating film stack 1335a is such to produce a total dielectric film structure 1335 that in some embodiments is greater than 2000 nm in thickness and in some embodiments less than 25000 nm. In yet other embodiments, the total dielectric film structure 1335 is in the range of 8000 to 12000 nm. In yet other embodiments, the number of repeating film stacks 1335 is two or more and the thickness of the dielectric film structure 1335 is greater than 2000 nm and less than 25000 nm.

In some embodiments, the thickness for the first film 1335a1 is in the range of 5 nm to 1000 nm. In some other embodiments, the thickness of the second film 1335a2 is in the range of to 1000 nm. In these and other embodiments, the thickness of the dielectric film structure 1335, which is the sum of the thicknesses of the repeating film structures 1335a, is greater than 2000 nm in thickness. In embodiments, the thickness of the sum of the repeating film structures 1335a is in the range of 4000 to 10000 nm.

It is to be understood that the number of films, the film thicknesses, the refractive indices, and the resulting composition of the films in the repeating film structure 1335a can be varied and remain within the spirit and scope of the dielectric stack structure 1335, and in the practice of utilizing the dielectric stack structure 1335 to provide low stress film structures and low optical signal attenuation for optical signals propagating through waveguides 1344 that are fabricated from embodiments of the dielectric stack structure 1335. In this regard, in some embodiments, an initial repeating film structure 1335a is used for two or more of the films in the dielectric stack 1335, and then a different repeating film structure 1335a is used for other two or more films in the same dielectric film structure 1335a to produce dielectric stack 1335. It is to be further understood that an initial repeating film structure 1335a can be used for two or more of the films in the dielectric film structure 1335, a different repeating film structure 1335a, can be used for another two or more films in the same dielectric film structure 1335, and then any number of additional repeating film structures 1335a with the same or different repeating film structures can be used for two or more additional films in the dielectric film structure 1335 and remain within the scope and spirit of the embodiments. In the foregoing discussion, the variations in the first film 1335a1 and second film 1335a2 can be produced with one or more variations in the refractive index, the thickness, and the composition or stoichiometry of the films.

It is also to be understood that in some embodiments, first film 1335a1 in the repeating film structure 1335a can include one or more films and remain within the scope of the invention. In an embodiment, first film 1335a1 in repeating film structure 1335a, for example, is 500 nm in thickness with a refractive index of 1.7. In another embodiment, first film 1335a1 includes a first part that is 250 nm in thickness with a refractive index of 1.7 and a second part that is 250 nm in thickness with a refractive index of 1.65. In yet another embodiment, the first film 1335a1 in the repeating film structure 1335a has a refractive index of 1.68 with a first partial thickness that is 250 nm and a second partial thickness that is deposited in a separate process step from the first, for example, and that is also 250 nm in thickness for a combined thickness of 500 nm for the two partial films of the first film 1335a1 of repeating film structure 1335a.

In some embodiments, the first film 1335a1 has a graded refractive index or stoichiometric composition. Gradations in the composition of the first film 1335a1 of the repeating film structure 1335a, for example, remain within the scope of the current invention. In some embodiments, the refractive index varies through part or all of the thickness of the first film 1335a1. Similarly, in some embodiments, the stoichiometric composition varies through part or all of the thickness of the first film 1335a1. Variations in the refractive index or the stoichiometric composition of the first film 1335a1 within the thickness of this film remain within the scope of the current invention.

It is also to be understood that in some embodiments, second film 1335a2 in the repeating film structure 1335a can include one or more films and remain within the scope of the invention. In an embodiment, second film 1335a2 in repeating film structure 1335a, for example, is 500 nm in thickness with a refractive index of 1.7. In another embodiment, second film 1335a2 includes a first part that is 250 nm in thickness with a refractive index of 1.7 and a second part that is 250 nm in thickness with a refractive index of 1.65. In yet another embodiment, the second film 1335a2 in the repeating film structure 1335a has a refractive index of 1.68 with a first partial thickness that is 250 nm and a second partial thickness that is deposited in a separate process step from the first, for example, that is also 250 nm for a combined thickness of 500 nm for the two partial films of the second film 1335a2 of the repeating film structure 1335a.

In some embodiments, the second film 1335a2 has a graded refractive index or stoichiometric composition. Gradations in the composition of the second film 1335a2 of the repeating film structure 1335a, for example, remain within the scope of the current invention. In some embodiments, the refractive index varies through part or all of the thickness of the second film 1335a2. Similarly, the stoichiometric composition varies through part or all of the thickness of the second film 1335a2. Variations in the refractive index or the stoichiometric composition of the second film 1335a2 within the thickness of this film remain within the scope of the current invention.

In some embodiments, repeating structure 1335 has an unequal number of first layers 1335a1 and second layers 1335a2. In some embodiments, repeating structure 1335 includes a first layer 1335a1 positioned between two second layers 1335a2.

In embodiments, top spacer or cladding layer 1339 is one or more layers of silicon dioxide or silicon oxynitride. In some embodiments, layer 1338a is a layer of one type of material, such as silicon dioxide. In some embodiments, layer 1339a is a layer of silicon oxynitride. In yet other embodiments, the layer 1339a is a layer of silicon oxynitride with refractive index of 1.55 and with a thickness of 500 nm. In yet other embodiments, layer 1339a is a layer of silicon oxynitride with thickness in the range of 100 to 1000 nm. Although in some embodiments, layer 1339a is included in the structure, in some other embodiments, the layer 1339 can be formed in combination with an optional top layer.

Dielectric layer 1339 can be a composite spacer layer 1339b of one or more layers of silicon oxynitride or silicon dioxide. In an embodiment, composite spacer layer 1339b includes two layers of silicon oxynitride with thicknesses of 250 nm and with a composite refractive index of approximately 1.55. In some embodiments, the sum of the thicknesses of the two layers in composite spacer layer 1339b is in the range of 1 to 1000 nm.

Similarly, the layer 1339 can be a composite layer 1339c of three or more layers with the same or different thicknesses and refractive indices, that when combined, provide a total thickness in the range of 1 nm to 1000 nm and a composite refractive index in the range of 1.4 to 2.02. In an embodiment, the index of refraction for the layer 1339 is less than the index of refraction for the core layer 1335 to facilitate containment of optical signals to the core waveguide layer 1335.

Optional top layer 1338 is one or more layers of a dielectric material such as silicon dioxide, silicon nitride, aluminum oxide, and aluminum nitride, among others. In some embodiments, a top layer 1338 of silicon dioxide with thickness of 200 nm and a refractive index of 1.445 is used. In some embodiments, the film thickness of the top layer can be several microns thick or thicker to facilitate planarization of the interposer structure for other films and optical and optoelectrical die that are placed over this dielectric layer. In some embodiments, silicon oxynitride is used in the optional top layer 1338. In some embodiments, another dielectric material or combination of materials such as aluminum nitride or aluminum oxide is used. In some embodiments, no optional top layer 1338 is provided. Layer 1338 can be, in some embodiments, a thick passivation layer that is used in the planarization of an interposer structure.

Referring to FIG. 13B, an example of an embodiment of another embodiment of a waveguide structure 1344. The waveguide structure 1344 in FIG. 13B is formed on substrate 1300 with a buffer layer 1333 with similar characteristics to that provided in the description of FIG. 13A. Layer 1337 is a bottom cladding layer that provides a lower refractive index than that of the core 1335 to facilitate confinement of optical signals propagating within the waveguide core 1335. In an embodiment, the layer 1337 is formed from a layer of silicon oxynitride with an index of refraction of 1.55. The thickness of the cladding layer 1337 can vary over a wide range to facilitate alignment of the core with other features on the interposer as described for example, in FIG. 10. In FIG. 10, the thickness of the cladding layer 1337 enables the position of the core 1335 to be in alignment with the core of an optical fiber.

Layer 1335 shown in FIG. 13B is a single layer of silicon oxynitride with refractive index of approximately 1.6. In this embodiment, the combination of refractive indices is suited for optical signals commonly used in optical communications networks.

Layer 1339 in the embodiment shown in FIG. 13B is a top cladding layer that provides a lower refractive index than that of the core 1335 to facilitate confinement of optical signals propagating within the waveguide core 1335. In an embodiment, the layer 1339 is formed from a layer of silicon oxynitride with an index of refraction of 1.55. The thickness of the cladding layer 1339 can vary over a wide range (tenths of microns to ten microns, for example, to facilitate the formation of a planarized layer from layer 1339 or in combination with layers above such as layer 1338.

Referring to FIG. 14, a schematic drawing of an embodiment of example neighboring PIC die 1402a, 1402b are shown. For the example PIC die 1402a, multiple sending devices 1422a are formed in the first optical circuitry 1406a and in which multiple receiving devices 1424a are formed in the second optical circuitry 1408a. The example embodiment is an example of a configuration in which the optoelectrical sending circuit 1406a is a multiplexer circuit and the optoelectrical receiving circuit 1408a is a demultiplexer circuit. The sending devices 1422a in first optoelectronic circuitry 1406a comprise two quad laser arrays 1422a. A quad array laser, in the embodiment shown, combines four lasers into a single package to simplify mounting of the multiple laser devices 1422a. Each laser 1422a in the quad array is connected via a section of planar waveguide 1444a to an electro-absorption modulator 1423a. A second planar waveguide section 1444a connects each electro absorption modulator 1423a to optical device 1440a, an optical multiplexer 1440a with eight input channels that combines the optical signals from the eight electro absorption modulators 1423a to form optical outgoing signal 1470a. During operation of an electrical test as described herein, the optical outgoing signal 1470a propagates in a section of optical waveguide 1444a to the edge of the die 1402a and to the loopback waveguide 1450b on the neighboring die 1402b, and then propagates through the loopback waveguide 1450b to the optical device 1442a in the second optical circuit 1408a. In the embodiment shown in FIG. 14, the optical device 1442a is an eight channel demultiplexer 1442a. The demultiplexer 1442a receives the combined multiwavelength ingoing optical signal 1470a from the loopback waveguide 1450b and distributes its constituent optical signals through waveguide sections 1444a and into receiving devices 1424a. In the embodiment shown, the receiving device 1424a is, for example, a photodiode 1424a. The loopback waveguide 1450b resides on the neighboring die 1402b but is used as described herein to test the functionality of the PIC die 1402a. Loopback waveguide 1450b, in the embodiment, is positioned in the embodiment around the electrical interface 1412b of the PIC die 1402b. In other embodiments, the loopback waveguide 1402b may not be integrated within features of the neighboring die 1402b. And in yet other embodiments, the loopback waveguide 1450b may be integrated within and around other features of the neighboring die 1402b.

The foregoing descriptions of embodiments have been presented for purposes of illustration and description and are not intended to be exhaustive or to limit embodiments to the forms disclosed. Modifications to, and variations of, the disclosed embodiments will be readily apparent to those skilled in the art, and the general principles defined herein may be applied to other embodiments without departing from the spirit and scope of the embodiments disclosed herein. Thus, embodiments should not be limited to those specifically described but rather are to be accorded the widest scope consistent with the principles and features disclosed herein.

What is claimed is:

1. A method comprising forming a sacrificial circuit on a substrate, the sacrificial circuit comprising
   an entrance,
      wherein the entrance is optically coupled to an output waveguide of an emitter circuit fabricated on the substrate,
      wherein the emitter circuit is configured to emit a first optical signal to the output waveguide;
   an exit,
      wherein the exit is optically coupled to an input waveguide of a receiver circuit fabricated on the substrate,
      wherein the receiver circuit is configured to receive a second optical signal received from the input waveguide;
   an electrical interface,
      wherein the electrical interface comprises contact pads electrically coupled to the emitter and receiver circuit, wherein the contact pads are configured to be contacted by an electrical tester for powering the emitter to emit the first optical signal and for powering the receiver to generate an electrical signal in response to the second optical signal, wherein at least a portion of the sacrificial circuit is fabricated in a neighbor portion, wherein the neighbor portion comprises a neighbor electrical interface, a neighbor emitter circuit and a neighbor receiver circuit, wherein the sacrificial circuit is routed from the output waveguide, around the neighbor electrical interface, and to the input waveguide;

simultaneously testing the emitter circuit and the receiver circuit using sacrificial circuit with the electrical tester;

removing or fabricating over at least a portion of the sacrificial circuit in a subsequent fabrication step after the testing step.

2. A method as in claim 1, wherein the sacrificial circuit comprises a waveguide comprising the entrance and exit at two ends of the waveguide, or wherein the sacrificial circuit comprises an optical device having an input coupled to the output waveguide and an output coupled to the input waveguide.

3. A method as in claim 1, wherein testing the emitter circuit and the receiver circuit comprises contacting the contact pads with multiple probes of the electrical tester during the testing process to power the emitter circuit and to power the receiver circuit;

measuring the electrical signal from the receiver circuit using the electrical tester, wherein the electrical signal is generated in response to the first optical signal.

4. A method as in claim 1, wherein the sacrificial circuit is fabricated in an area between a first portion and a second portion, wherein first portion comprises the emitter circuit, the receiver circuit, and the neighbor electrical interface, wherein the second portion comprises the neighbor emitter circuit and the neighbor receiver circuit.

5. A method as in claim 1, wherein the sacrificial circuit is further disposed interlaced with the neighbor emitter circuit or the neighbor receiver circuit.

6. A method as in claim 1, wherein the sacrificial circuit is fabricated in both of the emitter circuit and the neighbor emitter circuit or in both of the receiver circuit and the neighbor receiver circuit.

7. A method comprising forming an optoelectronic circuit on a substrate, the optoelectronic circuit comprising an emitter circuit, wherein the emitter circuit comprises a first device configured to emit a first optical signal;

a receiver circuit, wherein the receiver circuit comprises a second device configured to receive a second optical signal, wherein the receiver circuit is configured to generate an electrical signal in response to the second optical signal, an electrical interface, wherein the electrical interface comprises contact pads electrically coupled to the first and second devices;

forming a sacrificial circuit optically coupling to an output of the first device and to an input of the second device, wherein at least a portion of the sacrificial circuit is fabricated in a neighbor circuit, wherein the neighbor circuit comprises a neighbor electrical interface, a neighbor emitter circuit and a neighbor receiver circuit, wherein the sacrificial circuit is routed from the emitter circuit, around the neighbor electrical interface, and to the receiver circuit;

simultaneously testing the emitter circuit and the receiver circuit using the sacrificial circuit with an electrical tester;

removing or fabricating over at least a portion of the sacrificial circuit in a subsequent fabrication step after the testing step.

8. A method as in claim 7, wherein testing the emitter circuit and the receiver circuit comprises contacting the electrical interface for providing power to the first device to emit the first optical signal, and providing power to the second device to measure the electrical signal.

9. A method as in claim 7, wherein testing the emitter circuit and the receiver circuit comprises providing power to the first device to emit the first optical signal, wherein the first optical signal is emitted to the sacrificial circuit to the receiver circuit, measuring the electrical signal comprising measuring a response from the receiver circuit.

10. A method as in claim 7, wherein testing the emitter circuit and the receiver circuit comprises contacting the contact pads with multiple probes of the electrical tester to make the emitter circuit to emit the first optical signal to the sacrificial circuit to the receiver circuit;

measuring the electrical signal.

11. A method as in claim 7, further comprising forming an output coupler on the substrate on an output waveguide at the output of the emitter circuit or on the sacrificial circuit, wherein the output coupler is configured to house a first optical fiber for coupling to the output of the emitter circuit;

forming an input coupler on the substrate on the input waveguide at the input of the receiver circuit or on the sacrificial circuit, wherein the input coupler is configured to house a second optical fiber for coupling to the input of the receiver circuit.

12. A method as in claim 7, wherein the emitter circuit comprises multiple laser devices coupled to a multiplexor to generate the first optical signal comprising a composite optical signal, wherein the electrical tester is configured to provide power to the emitter circuit for the multiple laser devices to emit multiple individual optical signals having different wavelengths to the multiplexor.

13. A method as in claim 7, wherein the receiver circuit comprises a demultiplexor configured to receive the second optical signal comprising a composite optical signal, wherein the demultiplexor is configured to process the composite optical signal to generate multiple individual optical signals having different wavelengths, wherein the electrical tester is configured to provide power to the receiver circuit for generating the second multiple individual optical signals and to measure the multiple individual optical signals.

14. A method as in claim 7, wherein the emitter circuit comprises a laser device, wherein the electrical tester is configured to provide power to the laser device for the laser device to emit the first optical signal, wherein the receiver circuit comprises an optoelectronic device, wherein the optoelectronic device is configured to process the second optical signal and to generate an electrical signal corresponded to the second optical signal, wherein the electrical tester is configured to measure the electrical signal.

15. A method as in claim 7, wherein the sacrificial circuit comprises a waveguide comprising a first end coupled to the output of the first device and a second end coupled to the input of the second device, wherein the waveguide is routed from the emitter circuit, around the neighbor electrical interface, and to the receiver circuit.

16. A method comprising forming multiple optoelectronic circuits on a substrate, each optoelectronic circuit comprising
    an emitter circuit,
        wherein the emitter circuit comprises a first device configured to emit a first optical signal;
    a receiver circuit,
        wherein the receiver circuit comprises a second device configured to receive a second optical signal,
        wherein the receiver circuit is configured to generate an electrical signal corresponded to the second optical signal;
    a sacrificial circuit,
        wherein the sacrificial circuit comprises an entrance optically coupled to an output of the emitter circuit,
        wherein the sacrificial circuit comprises an exit optically coupled to an input of the receiver circuit,
        wherein the sacrificial circuit comprises an electrical interface comprising contact pads electrically coupled to the emitter and receiver circuits, with the contact pads configured to be contacted by an electrical tester, testing the emitter circuit and the receiver circuit of an optoelectronic circuit of the multiple optoelectronic circuits using the sacrificial circuit of the optoelectronic circuit with the electrical tester;

removing or fabricating over at least a portion of the sacrificial circuit of the optoelectronic circuit in a subsequent fabrication step after the testing step.

17. A method as in claim 16, further comprising forming an output coupler for at least an optoelectronic circuit of the multiple optoelectronic circuits,
    wherein the output coupler is configured to house a first optical fiber for coupling to the output of the emitter circuit;
    wherein the output coupler is disposed on an output waveguide at the output of the emitter circuit or on the sacrificial circuit;

forming an input coupler for the at least an optoelectronic circuit,
    wherein the input coupler is configured to house a second optical fiber for coupling to the input of the receiver circuit,
    wherein the input coupler is disposed on the input waveguide at the input of the receiver circuit or on the sacrificial circuit.

18. A method as in claim 16, further comprising separating the multiple optoelectronic circuit into individual optoelectronic circuits, wherein the separation passes through at least one of the emitter circuit, the receiver circuit, or the sacrificial circuit.

19. A method as in claim 16, further comprising forming an output coupler for at least an optoelectronic circuit of the multiple optoelectronic circuits,
    wherein the output coupler is configured to house a first optical fiber for coupling to the output of the emitter circuit;

forming an input coupler for the at least an optoelectronic circuit,
    wherein the input coupler is configured to house a second optical fiber for coupling to the input of the receiver circuit;

separating the multiple optoelectronic circuit into individual optoelectronic circuits, wherein the separation is configured to expose the output and input couplers for coupling the first and second optical fibers to the output of the emitter circuit and to the input of the receiver circuit, respectively.

20. A method as in claim 16, wherein testing the emitter circuit and the receiver circuit comprises
    contacting the contact pads with multiple probes of the electrical tester to make the emitter circuit to emit the first optical signal to the sacrificial circuit to the receiver circuit;
    measuring the electrical signal.

* * * * *